United States Patent
Lo et al.

(10) Patent No.: US 12,045,724 B2
(45) Date of Patent: Jul. 23, 2024

(54) NEURAL NETWORK ACTIVATION COMPRESSION WITH OUTLIER BLOCK FLOATING-POINT

(71) Applicant: Microsoft Technology Licensing, LLC, Redmond, WA (US)

(72) Inventors: Daniel Lo, Bothell, WA (US); Amar Phanishayee, Seattle, WA (US); Eric S. Chung, Woodinville, WA (US); Yiren Zhao, Cambridge (GB); Ritchie Zhao, Ithaca, NY (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 60 days.

(21) Appl. No.: 16/237,202

(22) Filed: Dec. 31, 2018

(65) Prior Publication Data
US 2020/0210839 A1   Jul. 2, 2020

(51) Int. Cl.
  *G06N 3/084*   (2023.01)
  *G06F 7/499*   (2006.01)
  (Continued)

(52) U.S. Cl.
  CPC ......... *G06N 3/084* (2013.01); *G06F 7/49915* (2013.01); *G06F 9/30025* (2013.01);
  (Continued)

(58) Field of Classification Search
  CPC ........ G06N 3/084; G06N 5/046; G06N 20/00; G06N 3/06; G06N 3/063; G06N 3/048;
  (Continued)

(56) References Cited

U.S. PATENT DOCUMENTS 4,872,132 A * 10/1989 Retter .................. G06F 7/483
                                                   708/404
5,657,350 A *  8/1997 Hofmann ............. G10L 19/06
                                                  704/E19.024
(Continued)

OTHER PUBLICATIONS

Drumond et al., "Training DNNs with Hybrid Block Floating Point", 2018, Proceedings of the 32nd International Conference on Neural Information Processing Systems, 32-2018, pp. 451-461 (Year: 2018).*

(Continued)

*Primary Examiner* — Ann J Lo
*Assistant Examiner* — Leonard A Sieger
(74) *Attorney, Agent, or Firm* — Klarquist Sparkman, LLP

(57) ABSTRACT

Apparatus and methods for training a neural network accelerator using quantized precision data formats having outlier values are disclosed, and in particular for storing activation values from a neural network in a compressed format for use during forward and backward propagation training of the neural network. In certain examples of the disclosed technology, a computing system is configured to perform forward propagation for a layer of a neural network to produced first activation values in a first block floating-point format. In some examples, activation values generated by forward propagation are converted by the compressor to a second block floating-point format having a narrower numerical precision than the first block floating-point format. Outlier values, comprising additional bits of mantissa and/or exponent are stored in ancillary storage for subset of the activation values. The compressed activation values are stored in the memory, where they can be retrieved for use during back propagation.

22 Claims, 15 Drawing Sheets

(51) Int. Cl.
  *G06F 9/30* (2018.01)
  *G06F 9/50* (2006.01)
  *G06N 5/046* (2023.01)
  *G06N 20/00* (2019.01)
(52) U.S. Cl.
  CPC ........... *G06F 9/5027* (2013.01); *G06N 5/046* (2013.01); *G06N 20/00* (2019.01)
(58) Field of Classification Search
  CPC ............. G06F 7/49915; G06F 9/30025; G06F 9/30032; G06F 9/5027; G06F 5/00; G06F 5/01; G06F 5/012; G06F 2207/3824; H03M 7/24; H03M 7/30; H03M 7/3059
  See application file for complete search history.

(56) References Cited

U.S. PATENT DOCUMENTS

| | | | |
|---|---|---|---|
| 6,144,977 | A | 11/2000 | Giangarra et al. |
| 8,401,863 | B1 | 3/2013 | Melkote et al. |
| 9,423,999 | B1 | 8/2016 | Linzer |
| 10,167,800 | B1 | 1/2019 | Chung et al. |
| 10,747,502 | B2* | 8/2020 | Pareek ................. G06F 9/3001 |
| 2004/0255284 | A1 | 12/2004 | Kobayashi |
| 2009/0037709 | A1 | 2/2009 | Ishii |
| 2010/0070836 | A1 | 3/2010 | Wegener et al. |
| 2012/0262597 | A1* | 10/2012 | Frantz ................... H04N 23/80 348/222.1 |
| 2014/0208068 | A1* | 7/2014 | Wegener ............ H03M 7/3059 712/22 |
| 2014/0289445 | A1 | 9/2014 | Savich |
| 2016/0117153 | A1 | 4/2016 | Salmon-legagneur et al. |
| 2016/0188293 | A1 | 6/2016 | Barat Quesada |
| 2016/0328646 | A1 | 11/2016 | Lin et al. |
| 2017/0061279 | A1 | 3/2017 | Yang et al. |
| 2017/0250704 | A1* | 8/2017 | Piirainen ................. H03M 7/24 |
| 2017/0286421 | A1 | 10/2017 | Hayenga et al. |
| 2017/0286830 | A1 | 10/2017 | El-yaniv et al. |
| 2017/0323197 | A1* | 11/2017 | Gibson .................... G06N 3/08 |
| 2017/0372202 | A1 | 12/2017 | Ginsburg et al. |
| 2018/0157465 | A1 | 6/2018 | Bittner et al. |
| 2018/0211152 | A1 | 7/2018 | Migacz et al. |
| 2018/0285733 | A1 | 10/2018 | Mellempudi et al. |
| 2018/0322607 | A1* | 11/2018 | Mellempudi ......... G06F 17/153 |
| 2019/0042944 | A1* | 2/2019 | Nair ....................... G06N 3/063 |
| 2019/0079727 | A1 | 3/2019 | Chen et al. |
| 2019/0163902 | A1 | 5/2019 | Reid et al. |
| 2019/0205746 | A1* | 7/2019 | Nurvitadhi ............. G06N 3/063 |
| 2019/0347072 | A1 | 11/2019 | Lo et al. |
| 2019/0373264 | A1* | 12/2019 | Chong ................... H04N 19/13 |
| 2020/0082269 | A1 | 3/2020 | Gao et al. |
| 2020/0104137 | A1 | 4/2020 | Natarajan et al. |
| 2020/0150968 | A1 | 5/2020 | Fatehi et al. |
| 2020/0210838 | A1 | 7/2020 | Lo et al. |
| 2020/0242474 | A1 | 7/2020 | Lo et al. |
| 2023/0037227 | A1 | 2/2023 | Narayan et al. |
| 2023/0140185 | A1 | 5/2023 | Lo et al. |
| 2024/0152758 | A1 | 5/2024 | Lo |

OTHER PUBLICATIONS

Hongxiang et al., "Reconfigurable Acceleration of 3D-CNNs for Human Action Recognition with Block Floating-Point Representation", 2018, 28th International Conference on Field Programmable Logic and Applications, 28-2018, pp. 287-294 (Year: 2018).*
Koster et al., "Flexpoint: An adaptive numerical format for efficient training of deep neural networks", 2017, Proceedings of the 31st International Conference on Neural Information Processing Systems, 31-2017, pp. 1740-1750 (Year: 2017).*
Han et al., "Deep Compression: Compressing Deep Neural Network with Pruning, Trained Quantization and Huffman Coding", 2017, Computer Vision and Pattern Recognition, 2016, pp. 1-14 (Year: 2016).*
Jo et. al., "Training Neural Networks with Low Precision Dynamic Fixed-Point", 2018, IEEE 36th International Conference on Computer Design (ICCD), 2018, pp. 405-408 (Year: 2018).*
Ling et al., "Harnessing Numerical Flexibility for Deep Learning on FPGAs", Jun. 2018, HEART 2018: Proceedings of the 9th International Symposium on Highly-Efficient Accelerators and Reconfigurable Technologies, 2018, pp. 1-3 (Year: 2018).*
Laerd Statistics, "Measures of Central Tendency", 2010, Laerd Statistics, Retrieved from https://web.archive.org/web/20101118061347/https://statistics.laerd.com/statistical-guides/measures-central-tendency-mean-mode-median.php (Year: 2010).*
Hattangady et al., "Block Floating Point Interval ALU for Digital Signal Processing", 2011, Reliable Computing, vol. 15 No. 2, pp. 69-80 (Year: 2011).*
Conde et al., "Reconfigurable Block Floating Point Processing Elements in Virtex Platforms", 2011, 2011 International Conference on Reconfigurable Computing and FPGAs, vol. 2011, pp. 509-512 (Year: 2011).*
Shaik et al., "A block floating point treatment to finite precision realization of the adaptive decision feedback equalizer", 2013, Signal Processing, vol. 93 No. 5, pp. 1162-1171 (Year: 2013).*
Kaczmarski et al., "Fixed length lightweight compression for GPU revised", 2017, Journal of Parallel and Distributed Computing, vol. 107, pp. 19-36 (Year: 2017).*
Yan et al., "Inverted Index Compression and Query Processing with Optimized Document Ordering", 2009, WWW '09: Proceedings of the 18th international conference on World wide web, vol. 18, pp. 401-410 (Year: 2009).*
Kobayashi et al., "A new approach for block-floating-point arithmetic", 1999, 1999 IEEE International Conference on Acoustics, Speech, and Signal Processing, vol. 4 (1999), pp. 2009-2012 (Year: 1999).*
Drumond et al., "Training DNNs with Hybrid Block Floating Point", 2018, arXiv, v4, pp. 1-11 (Year: 2018).*
Anonymous, Artificial Intelligence Index 2017 Annual Report, Nov. 2017, 101 pages.
Baydin et al., "Automatic Differentiation in Machine Learning: a Survey," Journal of Machine Learning Research 18 (2018), Feb. 5, 2018, 43 pages (also published as arXiv:1502.05767v4 [cs.SC] Feb. 5, 2018).
Bulò et al., "In-Place Activated BatchNorm for Memory-Optimized Training of DNNs," 2018 IEEE/CVF Conference on Computer Vision and Pattern Recognition, Jun. 2018, pp. 5639-5647 (also published as arXiv:1712.02616 [cs.CV]).
Burger, "Accelerating Persistent Neural Networks at Datacenter Scale," Microsoft Corporation, 52 pp. accessed Apr. 18, 2018, available at: https://www.microsoft.com/en-us/research/blog/microsoft-unveils-project-brainwave/.
Burger, "Microsoft Unveils Project Brainwave for Real-Time AI," Microsoft Corporation, 3 pp (Aug. 18, 2018).
Chen et al., "Compressing Neural Networks with the Hashing Trick," In International Conference on Machine Learning, pp. 2285-2294, 2015 (also cited as arXiv:1504.04788v1 [cs.LG] Apr. 19, 2015).
Chiu et al., State-of-the-art Speech Recognition with Sequence-to-Sequence Models. CoRR, abs/1712.01769, 2017 (also cited as arXiv: 1712.01769v6 [cs.CL] Feb. 23, 2018).
Chung et al., "Serving DNNs in Real Time at Datacenter Scale with Project Brainwave," IEEE Micro Pre-Print, 11 pages accessed Apr. 4, 2018, available at https://www.microsoft.com/en-us/research/uploads/prod/2018/03/mi0218_Chung-2018Mar25.pdf, also published as "Serving DNNs in Real Time at Datacenter Scale with Project Brainwave," IEEE Micro, vol. 38, Issue 2, Mar./Apr. 2018.
Colah, "Understanding LSTM Networks," posted on Aug. 27, 2015, 13 pages.
Courbariaux et al., "Low precision arithmetic for deep learning," also available as arXiv:1412.7024v1, Dec. 2014.
Courbariaux et al., "Binarized Neural Networks: Training Neural Networks with Weights and Activations Constrained to +1 or −1," arXiv preprint arXiv:1602.02830v3, Mar. 2016, 11 pages.
Courbariaux et al., "Binaryconnect: Training Deep Neural Networks with Binary Weights During Propagations," In Proceedings of the

(56) References Cited

OTHER PUBLICATIONS

28th International Conference on Neural Information Processing Systems, vol. 2, Dec. 2015, 9 pages.

Courbariaux et al., "Training Deep Neural Networks with Low Precision Multiplications," Sep. 23, 2015, 10 pages.

CS231n Convolutional Neural Networks for Visual Recognition, downloaded from cs231n.github.io/optimization-2, Dec. 20, 2018, 9 pages.

Denil et al., Predicting Parameters in Deep Learning, In Advances in Neural Information Processing Systems, Dec. 2013, pp. 2148-2156.

Elam et al., "A Block Floating Point Implementation for an N-Point FFT on the TMS320C55x DSP," Texas Instruments Application Report SPRA948, Sep. 2003, 13 pages.

"FFT/IFFT Block Floating Point Scaling," Altera Corporation Application Note 404, Oct. 2005, ver. 1.0, 7 pages.

Goodfellow et al., "Deep Learning," downloaded from http://www.deeplearningbook.org/ on May 2, 2018, (document dated 2016), 766 pages.

Gomez, "Backpropogating an LSTM: A Numerical Example," Apr. 18, 2016, downloaded from medium.com/@aidangomez/let-s-do-this-f9b699de31d9, Dec. 20, 2018, 8 pages.

Gupta et al., "Deep Learning with Limited Numerical Precision," Feb. 9, 2015, 10 pages.

Han et al., "Deep Compression: Compressing Deep Neural Networks with Pruning, Trained Quantization and Huffman Coding," arXiv preprint arXiv:1510.00149v5 [cs:CV], Feb. 15, 2016, 14 pages.

Hassan et al., "Achieving Human Parity on Automatic Chinese to English News Translation," CoRR, abs/1803.05567, 2018 (also published as arXiv:1803.05567v2 [cs.CL] Jun. 29, 2018).

He et al., "Deep Residual Learning for Image Recognition," arXiv preprint arXiv:1512.03385v1 [cs.CV] Dec. 10, 2015.

Ioffe et al., "Batch Normalization: Accelerating Deep Network Training by Reducing Internal Covariate Shift," arXiv:1502.03167v3 [cs.LG], Mar. 2015, 11 pages.

Jain et al., "Gist: Efficient Data Encoding for Deep Neural Network Training," 2018 ACM/IEEE 45th Annual International Symposium on Computer Architecture, Jun. 2018, 14 pages.

Karl N's Blog, "Batch Normalization—What the hey?," Posted on Jun. 7, 2016, downloaded from gab41.lab41.org/batch-normalization-what-the-hey-d480039a9e3b, Jan. 9, 2019, 7 pages.

Kevin's Blog, "Deriving the Gradient for the Backward Pass of Batch Normalization," Posted on Sep. 14, 2016, downloaded from kevinzakka.github.io/2016/09/14/batch_normalization/, Jan. 9, 2019, 7 pages.

Köster et al., "Flexpoint: An Adaptive Numerical Format for Efficient Training of Deep Neural Networks," In Advances in Neural Information Processing Systems, pp. 1742-1752, 2017 (also published as arXiv:1711.02213v2 [cs:LG] Dec. 2, 2017).

Kratzert's Blog, "Understanding the backward pass through Batch Normalization Layer," Posted on Feb. 12, 2016, downloaded from kratzert.github.io/2016/02/12/understanding-the-gradient-flow-through-the-bathch-nor . . . on Jan. 9, 2019, 17 pages.

Langhammer et al., "Floating-Point DSP Block Architecture for FPGAs," Proceedings of the 2015 ACM/SIGDA International Symposium on Field-Programmable Gate Arrays, Feb. 2015, pp. 117-125.

Le et al., "Neural Architecture Search with Reinforcement Learning," PowerPoint presentation, 37 pages.

Le, "A Tutorial on Deep Learning, Part 1: Nonlinear Classifiers and the Backpropagation Algorithm," Dec. 2015, 18 pages.

Le, "A Tutorial on Deep Learning, Part 2: Autoencoders, Convolutional Neural Networks and Recurrent Neural Networks," Oct. 2015, 20 pages.

Lecun et al., "Optimal Brain Damage," In Advances in Neural Information Processing Systems, Nov. 1989, pp. 598-605.

Li et al., "Stochastic Modified Equations and Adaptive Stochastic Gradient Algorithms," Proceedings of the 34th International Conference on Machine Learning, PMLR 70, 2017, 10 pages.

Li et al., "Ternary eight networks," arXiv preprint arXiv:1605.04711v2 [cs:CV] Nov. 19, 2016.

Lin et al., "Fixed Point Quantization of Deep Convolutional Networks," In International Conference on Machine Learning, pp. 2849-2858, 2016 (also published as arXiv:1511.06393v3 [cs:LG] Jun. 2, 2016).

Liu, "DARTS: Differentiable Architecture Search," arXiv:1806.09055v1 [cs.LG], Jun. 24, 2018, 12 pages.

Mellempudi et al., "Ternary Neural Networks with Fine-Grained Quantization," May 2017, 11 pages.

Mendis et al., "Helium: Lifting High-Performance Stencil Kernals from Stripped x86 Binaries to Halide DSL Code," Proceedings of the 36th ACM SIGPLAN Conference on Programming Languate Design and Implementation, Jun. 2015, pp. 391-402.

Mishra et al., "Apprentice: Using Knowledge Distillation Techniques to Improve Low-Precision Network Accuracy," arXiv preprint arXiv:1711.05852v1 [cs:LG] Nov. 15, 2017.

Muller et al., "Handbook of Floating-Point Arithmetic," Birkhäuser Boston (New York 2010), 78 pages including pp. 269-320.

Nielsen, "Neural Networks and Deep Learning," downloaded from http://neuralnetworksanddeeplearning.com/index.html on May 2, 2018, document dated Dec. 2017, 314 pages.

Nvidia. Nvidia tensorrt optimizer, https://developer.nvidia.com/tensorrt downloaded on Mar. 4, 2019, 9 pages.

Page, "Neural Networks and Deep Learning," www.cs.wise.edu/~dpage/cs760/, 73 pp.

Park et al., "Energy-efficient Neural Network Accelerator Based on Outlier-aware Low-precision Computation," 2018 ACM/IEEE 4th Annual International Symposium on Computer Architecture, Jun. 2018, pp. 688-698.

Rajagopal et al., "Synthesizing a Protocol Converter from Executable Protocol Traces," IEEE Transactions on Computers, vol. 40, No. 4, Apr. 1991, pp. 487-499.

Rajpurkar et al., "SQuAD: 100,000+ Questions for Machine Comprehension of Text," Proceedings of the 2016 Conference on Empirical Methods in Natural Language Processing, Nov. 2016, pp. 2383-2392.

Rastegari et al., "XNOR-Net: ImageNet Classification Using Binary Convolutional Neural Networks," In Proceedings of 14th Annual European Conference on Computer Vision, pp. 525-542. Oct. 2016.

"Russakovsky et al., ""ImageNet Large Scale Visual Recognition Challenge,"" International Journal of Computer Vision (IJCV), vol. 115, Issue 3, Dec. 2015, pp. 211-252 (also published as zrXiv:1409.0575v3 [cs.CV] Jan. 30, 2015)."

Russinovich, "Inside the Microsoft FPGA-based Configurable Cloud," Microsoft Corporation, https://channel9.msdn.com/Events/Build/2017/B8063, 8 pp. (May 8, 2017).

Russinovich, "Inside the Microsoft FPGA-based Configurable Cloud," Microsoft Corporation, Powerpoint Presentation; 41 pp. (May 8, 2017).

Smith et al., "A Bayesian Perspective on Generalization and Stochastic Gradient Descent," 6th International Conference on Learning Representations, Apr.-May 2018, 13 pages.

Szegedy et al., "Inception-v4, Inception-ResNet and the Impact of Residual Connections on Learning," arXiv:1602.07261v2, Aug. 23, 2016, 12 pages.

Szegedy et al., "Rethinking the Inception Architecture for Computer Vision," arXiv:1512.00567v3 [cs.CV] Dec. 11, 2015, 10 pages.

Tensorflow-slim image classification model library. https://github.com/tensorflow/models/tree/master/research/slim, downloaded on Mar. 4, 2019, 8 pages.

TITU1994 Blog, "Neural Architecture Search with Controller RNN," downloaded from github.com/titu1994/neural-architecture-search on Jan. 9, 2019, 3 pages.

Vanhoucke et al., "Improving the speed of neural networks on CPUs," In Deep Learning and Unsupervised Feature Learning Workshop, Dec. 2011, 8 pages.

Vucha et al., "Design and FPGA Implementation of Systolic Array Architecture for Matrix Multiplication," International Journal of Computer Applications, vol. 26, No. 3, Jul. 2011, 5 pages.

Weinberger et al., "Feature Hashing for Large Scale Multitask Learning," In Proceedings of the 26th Annual International Conference on Machine Learning, Jun. 2009, 8 pages.

(56) References Cited

OTHER PUBLICATIONS

Wen et al., "Learning Structured Sparsity in Deep Neural Networks," In Advances in Neural Information Processing Systems, Dec. 2016, pp. 2074-2082 (also published as arXiv:1608.036654v4 [cs.NE] Oct. 18, 2016).
Wilkinson, "Rounding Errors in Algebraic Processes," Notes on Applied Science No. 32, Department of Scientific and Industrial Research, National Physical Laboratory (United Kingdom) (London 1963), 50 pages including pp. 26-33, 79-91, and 122-139.
Wired, "Microsoft's Internet Business Gets a New Kind of Processor," 11 pp. Apr. 19, 2018, available at: https://www.wired.com/2016/09/microsoft-bets-future-chip-reprogram-fly/.
Xiong et al., "Achieving Human Parity in Conversational Speech Recognition," arXiv:1610.05256v2 [cs:CL] Feb. 17, 2017, 13 pages.
Yeh, "Deriving Batch-Norm Backprop Equations," downloaded from chrisyeh96.github.io/2017/08/28/deriving-batchnorm-backprop on Dec. 20, 2018, 5 pages.
Zhou et al., "DoReFa-net: Training Low Bitwidth Convolutional Neural Networks with Low Bitwidth Gradients," arXiv:1606.06160v3 [cs.NE] Feb. 2, 2018, 13 pages.
Zoph et al., "Learning Transferable Architectures for Scalable Image Recognition," arXiv.1707.07012v1, Jul. 2017, 14 pages.
Zoph et al., "Neural Architecture Search with Reinforcement Learning," 5th International Conference on Learning Representations, Apr. 2017, 16 pages.
Jacob, et al., "Quantization and Training of Neural Networks for Efficient Integer-Arithmetic-Only Inference", In Repository of arXiv:arXiv:1712.05877, Dec. 15, 2017, 14 Pages.
Li, et al., "Training Quantized Nets: A Deeper Understanding", In Repository of arxiv:https://arxiv.org/pdf/1706.02379.pdf, Nov. 13, 2017, 18 Pages.
"International Search Report and Written Opinion Issued in PCT Application No. PCT/US19/066433", dated Mar. 25, 2020, 12 Pages.
"International Search Report and Written Opinion Issued in PCT Application No. PCT/US20/012289", dated Mar. 19, 2020, 11 Pages.
Sahni, Manas, "8-Bit Quantization and TensorFlow Lite: Speeding up Mobile Inference with Low Precision", Retrieved From https://heartbeat.fritz.ai/8-bit-quantization-and-tensorflow-lite-speeding-up-mobile-inference-with-low-precision-a882dfcafbbd, Aug. 8, 2018, 14 Pages.
Wu, et al., "Training and Inference with Integers in Deep Neural Networks", In Repository of Arxiv: https://arxiv.org/pdf/1802.04680.pdf, Feb. 13, 2018, 14 Pages.
Das, et al., "Mixed Precision Training of Convolutional Neural Networks using Integer Operations", Published as a Conference Paper at ICLR, Feb. 3, 2018, 11 Pages.
Drumond, et al., "Training DNNs with Hybrid Block Floating Point", In Proceedings of The Neural Information Processing Systems, Apr. 4, 2018, 11 Pages.
"International Search Report and Written Opinion Issued in PCT Application No. PCT/US2019/066675", dated Apr. 14, 2020, 12 Pages.
Song, et al., "Computation Error Analysis of Block Floating Point Arithmetic Oriented Convolution Neural Network Accelerator Design", In 32nd AAAI Conference on Artificial Intelligence, Sep. 22, 2017, 8 Pages.
Park et al., "Cell division: weight bit-width reduction technique for convolutional neural network hardware accelerators," Proceedings of the 24th Asia and South Pacific Design Automation Conference, document dated Jan. 21, 2019, pp. 286-291.
Park et al., "Energy-efficient Neural Network Accelerator Based on Outlier-aware Low-precision Computation," 2018 ACM/IEEE 45th Annual International Symposium on Computer Architecture, Jun. 1, 2018, pp. 688-709.
Zhao et al., "Improving Neural Network Quantization without Retraining using Outlier Channel Splitting," arXiv:1901.09504v2 [cs.LG], document dated Jan. 30, 2019, 10 pages.
"Final Office Action Issued in U.S. Appl. No. 16/237,197", dated Jan. 24, 2022, 29 Pages.
"Non Final Office Action Issued in U.S. Appl. No. 16/237,197", dated May 17, 2021, 27 Pages.
"Rounding", Retrieved From: https://en.wikipedia.org/wiki/Rounding#Round_half_away_from_zero, Mar. 25, 2021, pp. 1-10.
US-2020-0242474-A1, Jul. 30, 2020.
US-2020-0210838-A1, Jul. 2, 2020.
U.S. Appl. No. 17/381,124, filed Jul. 20, 2021.
"Notice of Allowance Issued in U.S. Appl. No. 16/256,998", dated Sep. 20, 2022, 7 Pages.
Drumond, et al., "End-to-End DNN Training with Block Floating Point Arithmetic", In Repository of arXiv:1804.01526v2, Apr. 9, 2018, 09 Pages.
"International Search Report and Written Opinion Issued in PCT Application No. PCT/US22/031863", dated Sep. 15, 2022, 12 Pages.
"Non Final Office Action Issued in U.S. Appl. No. 16/256,998", dated May 2, 2022, 6 Pages.
"Non Final Office Action Issued in U.S. Appl. No. 16/237,197", dated Mar. 1, 2023, 34 Pages.
"Office Action Issued in Indian Patent Application No. 202147028192", dated Mar. 2, 2023, 10 Pages.
Galvan, et al., "First Quantization Matrix Estimation From Double Compressed JPEG Images", In Journal of Transactions on Information Forensics and Security, vol. 9, Issue 8, Aug. 2014, pp. 1299-1310.
Kim, et al., "Adaptive Quantization in Min-Sum based Irregular LDPC Decoder", In Proceedings of International Symposium on Circuits and Systems, May 18, 2008, pp. 536-539.
"Office Action Issued in Indian Patent Application No. 202147031749", dated Dec. 30, 2022, 6 Pages.
U.S. Appl. No. 18/092,876, filed Jan. 3, 2023.
U.S. Appl. No. 16/256,998 / 2020-0242474 / U.S. Pat. No. 11,562,247, filed Jan. 24, 2019 / Jul. 30, 2020 / Jan. 24, 2023.
U.S. Appl. No. 17/381,124 / 2020-0037227, filed Jul. 20, 2021 / Feb. 2, 2023.
"Office Action Issued in European Patent Application No. 20702718.6", dated Jul. 18, 2023, 6 Pages.
"Final Office Action Issued in U.S. Appl. No. 16/237,197", dated Sep. 13, 2023, 33 Pages.
"Notice of Allowance Issued in European Patent Application No. 19839200.3", dated Aug. 8, 2023, 8 Pages.
"Notice of Allowance Issued in U.S. Appl. No. 18/092,876", dated Oct. 2, 2023, 10 Pages.
U.S. Appl. No. 18/092,876 / 2023-0140185 filed Jan. 3, 2023 / May 4, 2023.
U.S. Appl. No. 16/256,998 / 2020-0242474 / 11,562,247 filed Jan. 24, 2019 / Jul. 30, 2020 / Jan. 24, 2023.
U.S. Appl. No. 16/237,197 / 2020-0210838 filed Dec. 31, 2008 / Jul. 2, 2020.
U.S. Appl. No. 17/381,124 / 2023-0037227 filed Jul. 20, 2021 / Feb. 2, 2023.
Office Action Received for Chinese Application No. 201980087238.3, mailed on Jan. 8, 2024, 19 pages (English Translation Provided).
Notice of Allowance mailed on Mar. 25, 2024, in U.S. Appl. No. 18/092,876, 5 pages.
Office Action Received for Chinese Application No. 202080010832.5, mailed on Apr. 28, 2024, 15 pages.

\* cited by examiner

FIG. 4
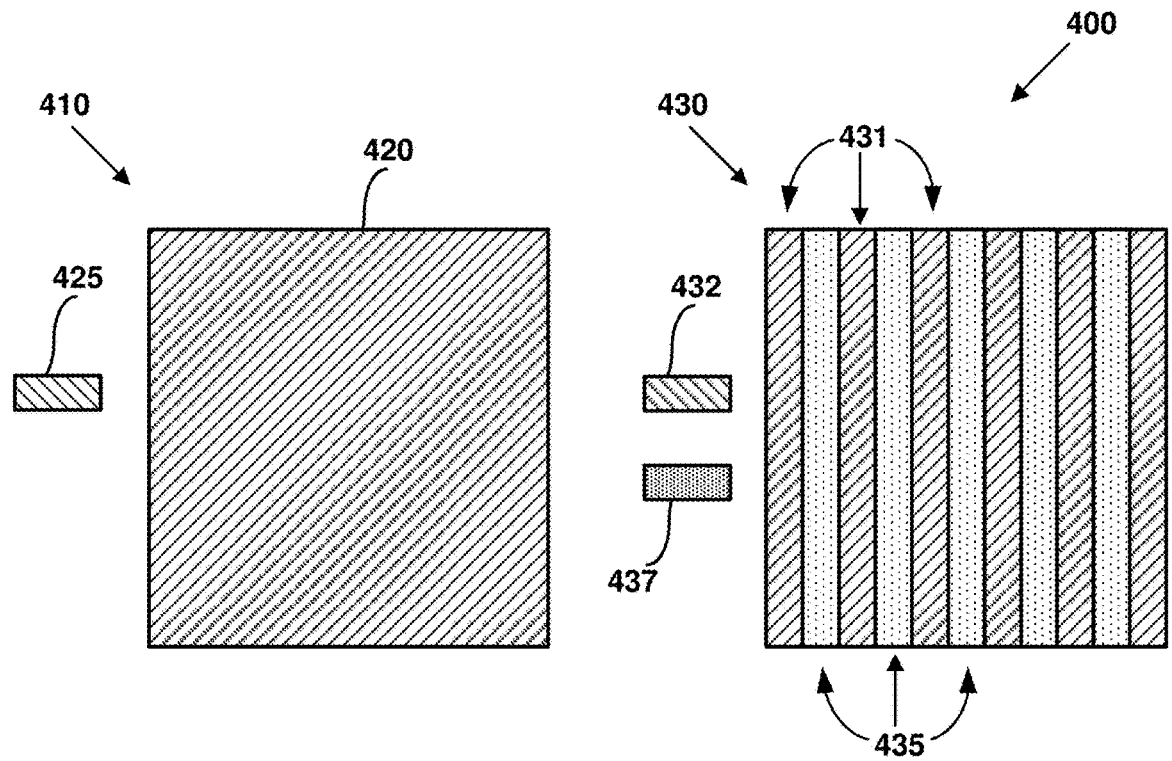
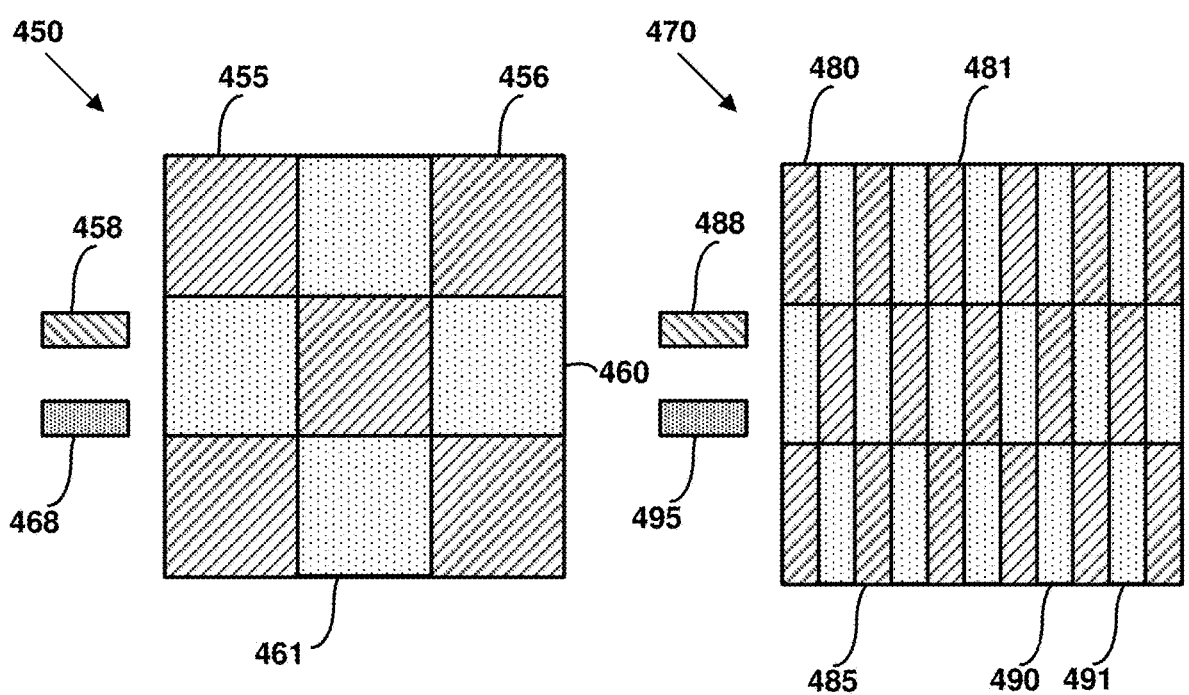

NEURAL NETWORK ACTIVATION COMPRESSION WITH OUTLIER BLOCK FLOATING-POINT

BACKGROUND

Machine learning (ML) and artificial intelligence (AI) techniques can be useful for solving a number of complex computational problems such as recognizing images and speech, analyzing and classifying information, and performing various classification tasks. Machine learning is a field of computer science that uses statistical techniques to give computer systems the ability to extract higher-level features from a set of training data. Specifically, the features can be extracted by training a model such as an artificial neural network (NN) or a deep neural network (DNN). After the model is trained, new data can be applied to the model and the new data can be classified (e.g., higher-level features can be extracted) using the trained model. Machine learning models are typically executed on a general-purpose processor (also referred to as a central processing unit (CPU)). However, training the models and/or using the models can be computationally expensive and so it may not be possible to perform feature extraction in real-time using general-purpose processors. Accordingly, there is ample opportunity for improvements in computer hardware and software to implement neural networks.

SUMMARY

Apparatus and methods are disclosed for storing activation values from a neural network in a compressed format for use during forward and backward propagation training of the neural network. In certain examples of the compressed format, all of the activation values are associated with a first mantissa in a block floating-point having a shared exponent and some but not all of the activation values are designated as having associated outlier values, and have a second mantissa associated with an exponent. Thus, the activation values associated with outlier values can be retrieved from the compressed format by appropriately combining the first and second mantissas and respective exponents. Computing systems suitable for employing such neural networks include computers having general-purpose processors, neural network accelerators, or reconfigure both logic devices, such as Field programmable gate arrays (FPGA). Activation values generated during forward propagation can be "stashed" (temporarily stored in bulk memory) in a compressed format and retrieved for use during backward propagation. The activation values used during training can be expressed in a quantized or block floating-point format (BFP). The activation values stashed can be in a further compressed format than the format used during the training.

In some examples of the disclosed technology, a computer system includes general-purpose and/or special-purpose neural network processors, bulk memory including computer-readable storage devices or memory, and a block floating-point compressor in communication with the bulk memory. As forward propagation occurs during training of neural network, activation values are produced in a first floating-point format. The block floating-point is used to convert the activation values to a block floating format, where the converted values have an associated first mantissa and a shared exponent, and a selected number of the converted values are outliers that also have an associated second mantissa and another exponent. The compressed activation values are stored in the bulk memory for use during backward propagation. Each of the selected outliers can be retrieved by combining a value defined by the first mantissa and shared exponent with a value defined by the second mantissa and its respective exponent.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. The foregoing and other objects, features, and advantages of the disclosed subject matter will become more apparent from the following detailed description, which proceeds with reference to the accompanying figures.

BRIEF DESCRIPTION OF THE DRAWINGS

FIG. 4 depicts a number of example block floating-point formats that can be used to represent quantized neural network models, as can be used in certain examples of the disclosed technology.

DETAILED DESCRIPTION

I. General Considerations

Figure 1:
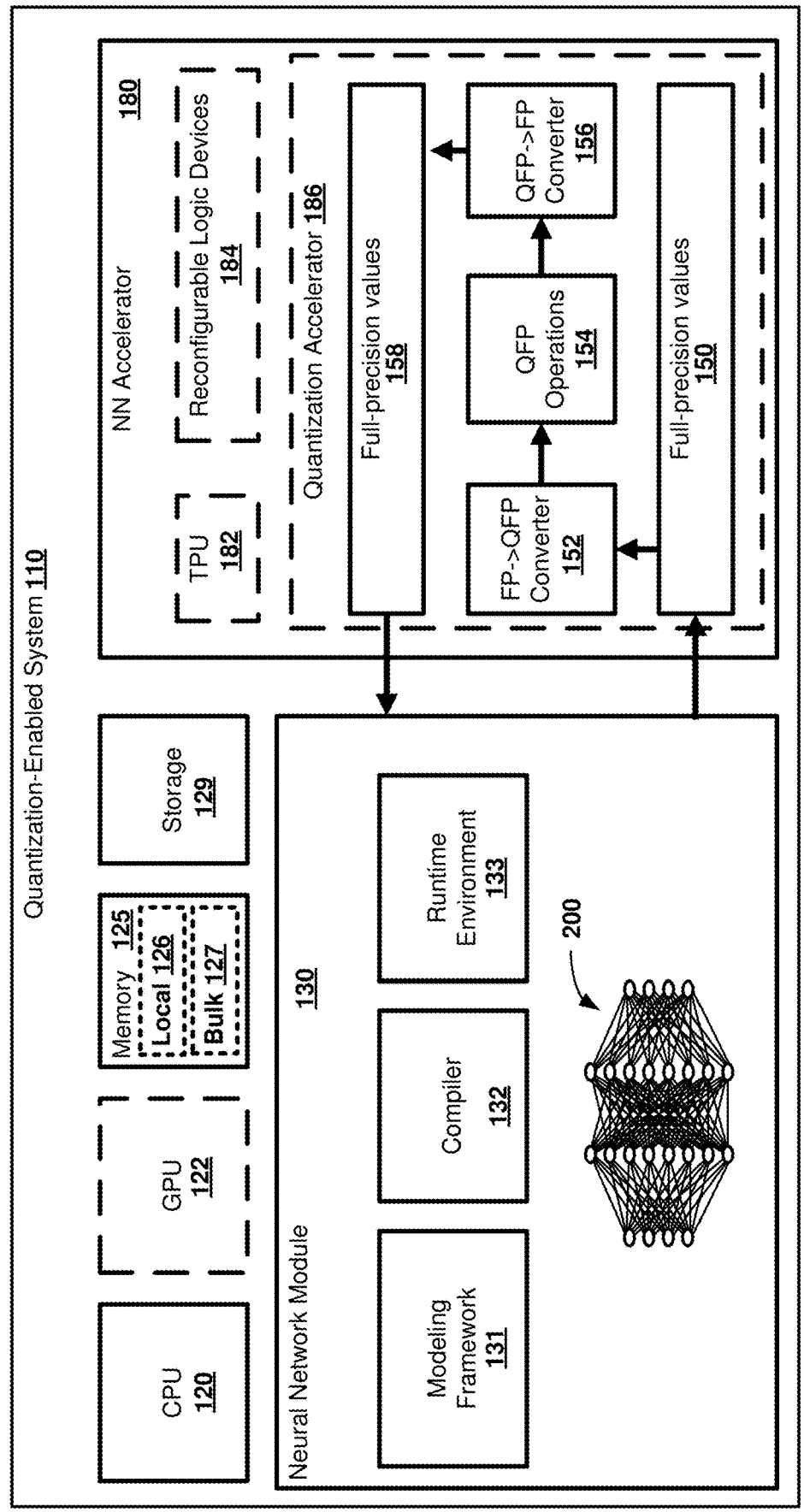
FIG. 1 is a block diagram of a quantization-enabled system for performing activation compression with outlier block floating point values, as can be implemented in certain examples of the disclosed technology.

This disclosure is set forth in the context of representative embodiments that are not intended to be limiting in any way.

As used in this application the singular forms "a," "an," and "the" include the plural forms unless the context clearly dictates otherwise. Additionally, the term "includes" means "comprises." Further, the term "coupled" encompasses mechanical, electrical, magnetic, optical, as well as other practical ways of coupling or linking items together, and does not exclude the presence of intermediate elements between the coupled items. Furthermore, as used herein, the term "and/or" means any one item or combination of items in the phrase.

The systems, methods, and apparatus described herein should not be construed as being limiting in any way. Instead, this disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed things and methods require that any one or more specific advantages be present or problems be solved. Furthermore, any features or aspects of the disclosed embodiments can be used in various combinations and subcombinations with one another.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and methods. Additionally, the description sometimes uses terms like "produce," "generate," "display," "receive," "verify," "execute," "perform," "convert," and "initiate" to describe the disclosed methods. These terms are high-level descriptions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be implemented as computer-executable instructions stored on one or more computer-readable media (e.g., computer-readable media, such as one or more optical media discs, volatile memory components (such as DRAM or SRAM), or nonvolatile memory components (such as hard drives)) and executed on a computer (e.g., any commercially available computer, including smart phones or other mobile devices that include computing hardware). Any of the computer-executable instructions for implementing the disclosed techniques, as well as any data created and used during implementation of the disclosed embodiments, can be stored on one or more computer-readable media (e.g., computer-readable storage media). The computer-executable instructions can be part of, for example, a dedicated software application or a software application that is accessed or downloaded via a web browser or other software application (such as a remote computing application). Such software can be executed, for example, on a single local computer or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C, C++, Java, or any other suitable programming language. Certain details of suitable computers and hardware are well-known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

II. Overview of Quantized Artificial Neural Networks

Artificial Neural Networks (ANNs or as used throughout herein, "NNs") are applied to a number of applications in Artificial Intelligence and Machine Learning including image recognition, speech recognition, search engines, and other suitable applications. The processing for these applications may take place on individual devices such as personal computers or cell phones, but it may also be performed in large datacenters. At the same time, hardware accelerators that can be used with NNs include specialized NN processing units, such as tensor processing units (TPUs) and Field Programmable Gate Arrays (FPGAs) programmed to accelerate neural network processing. Such hardware devices are being deployed in consumer devices as well as in data centers due to their flexible nature and low power consumption per unit computation.

Traditionally NNs have been trained and deployed using single-precision floating-point (32-bit floating-point or float32 format). However, it has been shown that lower precision floating-point formats, such as 16-bit floating-point (float16) or fixed-point formats can be used to perform inference operations with minimal loss in accuracy. On specialized hardware, such as FPGAs, reduced precision formats can greatly improve the latency and throughput of DNN processing.

Numbers represented in normal-precision floating-point format (e.g., a floating-point number expresses in a 16-bit floating-point format, a 32-bit floating-point format, a 64-bit floating-point format, or an 80-bit floating-point format) can be converted to quantized-precision format numbers may allow for performance benefits in performing operations. In particular, NN weights and activation values can be represented in a lower-precision quantized format with an acceptable level of error introduced. Examples of lower-precision quantized formats include formats having a reduced bit width (including by reducing the number of bits used to represent a number's mantissa or exponent) and block floating-point formats where two or more numbers share the same single exponent.

One of the characteristics of computation on an FPGA device is that it typically lacks hardware floating-point support. Floating-point operations may be performed at a penalty using the flexible logic, but often the amount of logic needed to support floating-point is prohibitive in FPGA implementations. Some newer FPGAs have been developed that do support floating-point computation, but even on these the same device can produce twice as many computational outputs per unit time as when it is used in an integer mode. Typically, NNs are created with floating-point computation in mind, but when an FPGA is targeted for NN processing it would be beneficial if the neural network could be expressed using integer arithmetic. Examples of the disclosed technology include hardware implementations of block floating-point (BFP), including the use of BFP in NN, FPGA, and other hardware environments.

A typical floating-point representation in a computer system consists of three parts: sign (s), exponent (e), and mantissa (m). The sign indicates if the number is positive or negative. The exponent and mantissa are used as in scientific notation:

$$\text{Value} = s \times m \times 2^e \quad \text{(Eq. 1)}$$

Any number may be represented, within the precision limits of the mantissa. Since the exponent scales the mantissa by powers of 2, just as the exponent does by powers of 10 in scientific notation, the magnitudes of very large numbers may be represented. The precision of the representation is determined by the precision of the mantissa. Typical floating-point representations use a mantissa of 10 (float 16), 24 (float 32), or 53 (float64) bits in width. An integer with magnitude greater than $2^{53}$ can be approximated in a float64 floating-point format, but it will not be represented exactly because there are not enough bits in the mantissa. A similar effect can occur for arbitrary fractions where the fraction is represented by bits of the mantissa that take on the value of negative powers of 2. There are many fractions that cannot be exactly represented because they are irrational in a binary number system. More exact representations are possible in both situations, but they may require the mantissa to contain more bits. Ultimately, an infinite number of mantissa bits are required to represent some numbers exactly (e.g., $\frac{1}{3} = 0.\overline{3}$; $\frac{22}{7} = 3.\overline{142857}$). The 10-bit (half precision float), 24-bit (single precision float), and 53-bit (double precision float) mantissa limits are common compromises of mantissa storage requirements versus representation precision in general-purpose computers.

With block floating-point formats, a group of two or more numbers use a single shared exponent with each number still having its own sign and mantissa. In some examples, the shared exponent is chosen to be the largest exponent of the original floating-point values. For purposes of the present disclosure, the term block floating-point (BFP) means a number system in which a single exponent is shared across two or more values, each of which is represented by a sign and mantissa pair (whether there is an explicit sign bit, or the mantissa itself is signed). In some examples, all values of one or more rows or columns of a matrix or vector, or all values of a matrix or vector, can share a common exponent. In other examples, the BFP representation may be unsigned. In some examples, some but not all of the elements in a matrix or vector BFP representation may include numbers represented as integers, floating-point numbers, fixed point numbers, symbols, or other data formats mixed with numbers represented with a sign, mantissa, and exponent. In some examples, some or all of the elements in a matrix or vector BFP representation can include complex elements having two or more parts, for example: complex numbers with an imaginary component (a+bi, where $i=\sqrt{-1}$); fractions including a numerator and denominator, in polar coordinates (r, θ), or other multi-component element.

Parameters of particular BFP formats can be selected for a particular implementation to tradeoff precision and storage requirements. For example, rather than storing an exponent with every floating-point number, a group of numbers can share the same exponent. To share exponents while maintaining a high level of accuracy, the numbers should have close to the same magnitude, since differences in magnitude are expressed in the mantissa. If the differences in magnitude are too great, the mantissa will overflow for the large values, or may be zero ("underflow") for the smaller values. Depending on a particular application, some amount of overflow and/or underflow may be acceptable.

The size of the mantissa can be adjusted to fit a particular application. This can affect the precision of the number being represented, but potential gains are realized from a reduced representation size. For example, a normal single-precision float has a size of four bytes, but for certain implementations of the disclosed technology, only two bytes are used to represent the sign and mantissa of each value. In some implementations, the sign and mantissa of each value can be represented in a byte or less.

In certain examples of the disclosed technology, the representation expressed above is used to derive the original number from the representation, but only a single exponent is stored for a group of numbers, each of which is represented by a signed mantissa. Each signed mantissa can be represented by two bytes or less, so in comparison to four-byte floating-point, the memory storage savings is about 2×. Further, the memory bandwidth requirements of loading and storing these values are also approximately one-half that of normal floating-point.

Neural network operations are used in many artificial intelligence operations. Often, the bulk of the processing operations performed in implementing a neural network is in performing Matrix×Matrix or Matrix×Vector multiplications or convolution operations. Such operations are compute- and memory-bandwidth intensive, where the size of a matrix may be, for example, 1000×1000 elements (e.g., 1000×1000 numbers, each including a sign, mantissa, and exponent) or larger and there are many matrices used. As discussed herein, BFP techniques can be applied to such operations to reduce the demands for computation as well as memory bandwidth in a given system, whether it is an FPGA, CPU, or another hardware platform. As used herein, the use of the term "element" herein refers to a member of such a matrix or vector.

As used herein, the term "tensor" refers to a multi-dimensional array that can be used to represent properties of a NN and includes one-dimensional vectors as well as two-, three-, four-, or larger dimension matrices. As used in this disclosure, tensors do not require any other mathematical properties unless specifically stated.

As used herein, the term "normal-precision floating-point" refers to a floating-point number format having a mantissa, exponent, and optionally a sign and which is natively supported by a native or virtual CPU. Examples of normal-precision floating-point formats include, but are not limited to, IEEE 754 standard formats such as 16-bit, 32-bit, 64-bit, or to other processors supported by a processor, such as Intel AVX, AVX2, IA32, x86_64, or 80-bit floating-point formats.

A given number can be represented using different precision (e.g., different quantized precision) formats. For example, a number can be represented in a higher precision format (e.g., float32) and a lower precision format (e.g., float16). Lowering the precision of a number can include reducing the number of bits used to represent the mantissa or exponent of the number. Additionally, lowering the precision of a number can include reducing the range of values that can be used to represent an exponent of the number, such as when multiple numbers share a common exponent. Similarly, increasing the precision of a number can include increasing the number of bits used to represent the mantissa or exponent of the number. Additionally, increasing the precision of a number can include increasing the range of values that can be used to represent an exponent of the number, such as when a number is separated from a group of numbers that shared a common exponent. As used herein, converting a number from a higher precision format to a lower precision format may be referred to as down-casting or quantizing the number. Converting a number from a lower precision format to a higher precision format may be referred to as up-casting or de-quantizing the number.

As used herein, the term "quantized-precision floating-point" refers to a floating-point number format where two or more values of a tensor have been modified to have a lower precision than when the values are represented in normal-precision floating-point. In particular, many examples of quantized-precision floating-point representations include block floating-point formats, where two or more values of the tensor are represented with reference to a common exponent. The quantized-precision floating-point number can be generated by selecting a common exponent for two, more, or all elements of a tensor and shifting mantissas of individual elements to match the shared, common exponent. In some examples, groups of elements within a tensor can share a common exponent on, for example, a per-row, per-column, per-tile, or other basis.

In one example of the disclosed technology, a neural network accelerator is configured to performing training operations for layers of a neural network, including forward propagation and back propagation. The values of one or more of the neural network layers can be expressed in a quantized format, that has lower precision than normal-precision floating-point formats. For example, block floating-point formats can be used to accelerate computations performed in training and inference operations using the neural network accelerator. Use of quantized formats can improve neural network processing by, for example, allowing for faster hardware, reduced memory overhead, simpler hardware design, reduced energy use, reduced integrated circuit area, cost savings and other technological improvements. It is often desirable that operations be performed to mitigate noise or other inaccuracies introduced by using lower-precision quantized formats. Further, portions of neural network training, such as temporary storage of activation values, can be improved by compressing a portion of these values (e.g., for an input, hidden, or output layer of a neural network), either from normal-precision floating-point or from a first block floating-point, to a lower precision number format. The activation values can be later retrieved for use during, for example, back propagation during the training phase.

An input tensor for the given layer can be converted from a normal-precision floating-point format to a quantized-precision floating-point format. A tensor operation can be performed using the converted input tensor. A result of the tensor operation can be converted from the block floating-point format to the normal-precision floating-point format. The tensor operation can be performed during a forward-propagation mode or a back-propagation mode of the neural network. For example, during a back-propagation mode, the input tensor can be an output error term from a layer adjacent to (e.g., following) the given layer or weights of the given layer. As another example, during a forward-propagation mode, the input tensor can be an output term from a layer adjacent to (e.g., preceding) the given layer or weights of the given layer. The converted result can be used to generate an output tensor of the layer of the neural network, where the output tensor is in normal-precision floating-point format. In this manner, the neural network accelerator can potentially be made smaller and more efficient than a comparable accelerator that uses only a normal-precision floating-point format. A smaller and more efficient accelerator may have increased computational performance and/or increased energy efficiency. Additionally, the neural network accelerator can potentially have increased accuracy compared to an accelerator that uses only a quantized-precision floating-point format. By increasing the accuracy of the accelerator, a convergence time for training may be decreased and the accelerator may be more accurate when classifying inputs to the neural network. Reducing the computational complexity of using the models can potentially decrease the time to extract a feature during inference, decrease the time for adjustment during training, and/or reduce energy consumption during training and/or inference.

III. Example Architectures for Implementing Activation Compression with Narrow Block Floating-Point FIG. 1 is a block diagram 100 outlining an example quantization-enabled system 110 as can be implemented in certain examples of the disclosed technology, including for use in activation compression with narrow block floating-point. As shown in FIG. 1, the quantization-enabled system 110 can include a number of hardware resources including general-purpose processors 120 and special-purpose processors such as graphics processing units 122 and neural network accelerator 180. The processors are coupled to memory 125 and storage 129, which can include volatile or non-volatile memory devices. The processors 120 and 122 execute instructions stored in the memory or storage in order to provide a neural network module 130. The neural network module 130 includes software interfaces that allow the system to be programmed to implement various types of neural networks. For example, software functions can be provided that allow applications to define neural networks including weights, biases, activation functions, node values, and interconnections between layers of a neural network. Additionally, software functions can be used to define state elements for recurrent neural networks. The neural network module 130 can further provide utilities to allow for training and retraining of a neural network implemented with the module. Values representing the neural network module are stored in memory or storage and are operated on by instructions executed by one of the processors. The values stored in memory or storage can be represented using normal-precision floating-point and/or quantized floating-point values.

In some examples, proprietary or open source libraries or frameworks are provided to a programmer to implement neural network creation, training, and evaluation. Examples of such libraries include TensorFlow, Microsoft Cognitive Toolkit (CNTK), Caffe, Theano, and Keras. In some examples, programming tools such as integrated development environments provide support for programmers and users to define, compile, and evaluate NNs.

The neural network accelerator 180 can be implemented as a custom or application-specific integrated circuit (e.g., including a system-on-chip (SoC) integrated circuit), as a field programmable gate array (FPGA) or other reconfigurable logic, or as a soft processor virtual machine hosted by a physical, general-purpose processor. The neural network accelerator 180 can include a tensor processing unit 182, reconfigurable logic devices 184, and/or one or more neural processing cores (such as the quantization accelerator 186). The quantization accelerator 186 can be configured in hardware, software, or a combination of hardware and software. As one example, the quantization accelerator 186 can be configured and/or executed using instructions executable on the tensor processing unit 182. As another example, the quantization accelerator 186 can be configured by programming reconfigurable logic blocks 184. As another example, the quantization accelerator 186 can be configured using hard-wired logic gates of the neural network accelerator 180.

The quantization accelerator 186 can be programmed to execute a subgraph, an individual layer, or a plurality of layers of a neural network. For example, the quantization accelerator 186 can be programmed to perform operations for all or a portion of a layer of a NN. The quantization accelerator 186 can access a local memory used for storing weights, biases, input values, output values, forget values, state values, and so forth. The quantization accelerator 186 can have many inputs, where each input can be weighted by a different weight value. For example, the quantization accelerator 186 can produce a dot product of an input tensor and the programmed input weights for the quantization accelerator 186. In some examples, the dot product can be adjusted by a bias value before it is used as an input to an activation function. The output of the quantization accelerator 186 can be stored in the local memory, where the output value can be accessed and sent to a different NN processor core and/or to the neural network module 130 or the memory 125, for example. Intermediate values in the quantization accelerator can often be stored in a smaller or more local memory, while values that may not be needed until later in a training process can be stored in a "bulk memory" a larger, less local memory (or storage device, such as on an SSD (solid state drive) or hard drive). For example, during training forward propagation, once activation values for a next layer in the NN have been calculated, those values may not be accessed until for propagation through all layers has completed. Such activation values can be stored in such a bulk memory.

The neural network accelerator 180 can include a plurality 110 of quantization accelerators 186 that are connected to each other via an interconnect (not shown). The interconnect can carry data and control signals between individual quantization accelerators 186, a memory interface (not shown), and an input/output (I/O) interface (not shown). The interconnect can transmit and receive signals using electrical, optical, magnetic, or other suitable communication technology and can provide communication connections arranged according to a number of different topologies, depending on a particular desired configuration. For example, the interconnect can have a crossbar, a bus, a point-to-point bus, or other suitable topology. In some examples, any one of the plurality of quantization accelerators 186 can be connected to any of the other cores, while in other examples, some cores are only connected to a subset of the other cores. For example, each core may only be connected to a nearest 4, 8, or 10 neighboring cores. The interconnect can be used to transmit input/output data to and from the quantization accelerators 186, as well as transmit control signals and other information signals to and from the quantization accelerators 186. For example, each of the quantization accelerators 186 can receive and transmit semaphores that indicate the execution status of operations currently being performed by each of the respective quantization accelerators 186. Further, matrix and vector values can be shared between quantization accelerators 186 via the interconnect. In some examples, the interconnect is implemented as wires connecting the quantization accelerators 186 and memory system, while in other examples, the core interconnect can include circuitry for multiplexing data signals on the interconnect wire(s), switch and/or routing components, including active signal drivers and repeaters, or other suitable circuitry. In some examples of the disclosed technology, signals transmitted within and to/from neural network accelerator 180 are not limited to full swing electrical digital signals, but the neural network accelerator 180 can be configured to include differential signals, pulsed signals, or other suitable signals for transmitting data and control signals.

In some examples, the quantization-enabled system 110 can include an optional quantization emulator that emulates functions of the neural network accelerator 180. The neural network accelerator 180 provides functionality that can be used to convert data represented in full precision floating-point formats in the neural network module 130 into quantized format values. The neural network accelerator 180 can also perform operations using quantized format values. Such functionality will be discussed in further detail below.

The neural network module 130 can be used to specify, train, and evaluate a neural network model using a tool flow that includes a hardware-agnostic modelling framework 131 (also referred to as a native framework or a machine learning execution engine), a neural network compiler 132, and a neural network runtime environment 133. The memory includes computer-executable instructions for the tool flow including the modelling framework 131, the neural network compiler 132, and the neural network runtime environment 133. The tool flow can be used to generate neural network data 200 representing all or a portion of the neural network model, such as the neural network model discussed below regarding FIG. 2. It should be noted that while the tool flow is described as having three separate tools (131, 132, and 133), the tool flow can have fewer or more tools in various examples. For example, the functions of the different tools (131, 132, and 133) can be combined into a single modelling and execution environment. In other examples, where a neural network accelerator is deployed, such a modeling framework may not be included.

The neural network data 200 can be stored in the memory 125, which can include local memory 126, which is typically implemented as static random access memory (SRAM), embedded dynamic random access memory (eDRAM), in latches or flip-flops in a register file, in a block RAM, or other suitable structure, and bulk memory 127, which is typically implemented in memory structures supporting larger, but often slower access than the local memory 126. For example, the bulk memory may be off-chip DRAM, network accessible RAM, SSD drives, hard drives, or network-accessible storage. Depending on a particular memory technology available, other memory structures, including the foregoing structures recited for the local memory, may be used to implement bulk memory. The neural network data 200 can be represented in one or more formats. For example, the neural network data 200 corresponding to a given neural network model can have a different format associated with each respective tool of the tool flow. Generally, the neural network data 200 can include a description of nodes, edges, groupings, weights, biases, activation functions, and/or tensor values. As a specific example, the neural network data 200 can include source code, executable code, metadata, configuration data, data structures and/or files for representing the neural network model.

The modelling framework 131 can be used to define and use a neural network model. As one example, the modelling framework 131 can include pre-defined APIs and/or programming primitives that can be used to specify one or more aspects of the neural network model. The pre-defined APIs can include both lower-level APIs (e.g., activation functions, cost or error functions, nodes, edges, and tensors) and higher-level APIs (e.g., layers, convolutional neural networks, recurrent neural networks, linear classifiers, and so forth). "Source code" can be used as an input to the modelling framework 131 to define a topology of the graph of a given neural network model. In particular, APIs of the modelling framework 131 can be instantiated and interconnected within the source code to specify a complex neural network model. A data scientist can create different neural network models by using different APIs, different numbers of APIs, and interconnecting the APIs in different ways.

In addition to the source code, the memory 125 can also store training data. The training data includes a set of input data for applying to the neural network model 200 and a desired output from the neural network model for each respective dataset of the input data. The modelling framework 131 can be used to train the neural network model with the training data. An output of the training is the weights and biases that are associated with each node of the neural network model. After the neural network model is trained, the modelling framework 131 can be used to classify new data that is applied to the trained neural network model. Specifically, the trained neural network model uses the weights and biases obtained from training to perform classification and recognition tasks on data that has not been used to train the neural network model. The modelling framework 131 can use the CPU 120 and the special-purpose processors (e.g., the GPU 122 and/or the neural network accelerator 180) to execute the neural network model with increased performance as compare with using only the CPU 120. In some examples, the performance can potentially achieve real-time performance for some classification tasks.

The compiler 132 analyzes the source code and data (e.g., the examples used to train the model) provided for a neural network model and transforms the model into a format that can be accelerated on the neural network accelerator 180, which will be described in further detail below. Specifically, the compiler 132 transforms the source code into executable code, metadata, configuration data, and/or data structures for representing the neural network model and memory as neural network data 200. In some examples, the compiler 132 can divide the neural network model into portions (e.g., neural network 200) using the CPU 120 and/or the GPU 122) and other portions (e.g., a subgraph, an individual layer, or a plurality of layers of a neural network) that can be executed on the neural network accelerator 180. The compiler 132 can generate executable code (e.g., runtime modules) for executing NNs assigned to the CPU 120 and for communicating with a subgraph, an individual layer, or a plurality of layers of a neural network assigned to the accelerator 180. The compiler 132 can generate configuration data for the accelerator 180 that is used to configure accelerator resources to evaluate the subgraphs assigned to the optional accelerator 180. The compiler 132 can create data structures for storing values generated by the neural network model during execution and/or training and for communication between the CPU 120 and the accelerator 180. The compiler 132 can generate metadata that can be used to identify subgraphs, edge groupings, training data, and various other information about the neural network model during runtime. For example, the metadata can include information for interfacing between the different subgraphs or other portions of the neural network model.

The runtime environment 133 provides an executable environment or an interpreter that can be used to train the neural network model during a training mode and that can be used to evaluate the neural network model in training, inference, or classification modes. During the inference mode, input data can be applied to the neural network model inputs and the input data can be classified in accordance with the training of the neural network model. The input data can be archived data or real-time data.

The runtime environment 133 can include a deployment tool that, during a deployment mode, can be used to deploy or install all or a portion of the neural network to neural network accelerator 180. The runtime environment 133 can further include a scheduler that manages the execution of the different runtime modules and the communication between the runtime modules and the neural network accelerator 180. Thus, the runtime environment 133 can be used to control the flow of data between nodes modeled on the neural network module 130 and the neural network accelerator 180.

In one example, the neural network accelerator 180 receives and returns normal-precision values 150 from the neural network module 130. As illustrated in FIG. 1, the quantization accelerator 186 can perform a bulk of its operations using quantized floating-point and an interface between the quantization accelerator 186 and the neural network module 130 can use full-precision values for communicating information between the modules. The normal-precision values can be represented in 16-, 32-, 64-bit, or other suitable floating-point format. For example, a portion of values representing the neural network can be received, including edge weights, activation values, or other suitable parameters for quantization. The normal-precision values 150 are provided to a normal-precision floating-point to quantized floating-point converter 152, which converts the normal-precision value into quantized values. Quantized floating-point operations 154 can then be performed on the quantized values. The quantized values can then be converted back to a normal-floating-point format using a quantized floating-point to normal-floating-point converter 156 which produces normal-precision floating-point values. As a specific example, the quantization accelerator 186 can be used to accelerate a given layer of a neural network, and the vector-vector, matrix-vector, matrix-matrix, and convolution operations can be performed using quantized floating-point operations and less compute-intensive operations (such as adding a bias value or calculating an activation function) can be performed using normal floating-point precision operations.

The conversions between normal floating-point and quantized floating-point performed by the converters 152 and 156 are typically performed on sets of numbers represented as vectors or multi-dimensional matrices. In some examples, additional normal-precision operations 158, including operations that may be desirable in particular neural network implementations can be performed based on normal-precision formats including adding a bias to one or more nodes of a neural network, applying a hyperbolic tangent function or other such sigmoid function, or rectification functions (e.g., ReLU operations) to normal-precision values that are converted back from the quantized floating-point format.

In some examples, the quantized values are used and stored only in the logic gates and internal memories of the neural network accelerator 180, and the memory 125 and storage 129 store only normal floating-point values. For example, the neural network accelerator 180 can quantize the inputs, weights, and activations for a neural network model that are received from the neural network model 130 and can de-quantize the results of the operations that are performed on the neural network accelerator 180 before passing the values back to the neural network model 130. Values can be passed between the neural network model 130 and the neural network accelerator 180 using the memory 125, the storage 129, or an input/output interface (not shown). In other examples, an emulator provides full emulation of the quantization, including only storing one copy of the shared exponent and operating with reduced mantissa widths. Some results may differ over versions where the underlying operations are performed in normal floating-point. For example, certain examples can check for underflow or overflow conditions for a limited, quantized bit width (e.g., 3-, 4-, or 5-bit wide mantissas).

The bulk of the computational cost of DNNs is in vector-vector, matrix-vector, and matrix-matrix multiplications and/or convolutions. These operations are quadratic in input sizes while operations such as bias add and activation functions are linear in input size. Thus, in some examples, quantization is only applied to matrix-vector multiplication operations, which is implemented on the neural network accelerator 180. In such examples, all other operations are done in a normal-precision format, such as float16. Thus, from the user or programmer's perspective, the quantization-enabled system 110 accepts and outputs normal-precision float16 values from/to the neural network module 130 and output float16 format values. All conversions to and from block floating-point format can be hidden from the programmer or user. In some examples, the programmer or user may specify certain parameters for quantization operations. In other examples, quantization operations can take advantage of block floating-point format to reduce computation complexity, as discussed below regarding FIG. 3.

The neural network accelerator 180 is used to accelerate evaluation and/or training of a neural network graph or subgraphs, typically with increased speed and reduced latency that is not realized when evaluating the subgraph using only the CPU 120 and/or the GPU 122. In the illustrated example, the accelerator includes a Tensor Processing Unit (TPU) 182, reconfigurable logic devices 184 (e.g., contained in one or more FPGAs or a programmable circuit fabric), and/or a quantization accelerator 186, however any suitable hardware accelerator can be used that models neural networks. The accelerator 180 can include configuration logic which provides a soft CPU. The soft CPU supervises operation of the accelerated graph or subgraph on the accelerator 180 and can manage communications with the neural network module 130. The soft CPU can also be used to configure logic and to control loading and storing of data from RAM on the accelerator, for example in block RAM within an FPGA.

In some examples, parameters of the neural network accelerator 180 can be programmable. The neural network accelerator 180 can be used to prototype training, inference, or classification of all or a portion of the neural network model 200. For example, quantization parameters can be selected based on accuracy or performance results obtained by prototyping the network within neural network accelerator 180. After a desired set of quantization parameters is selected, a quantized model can be programmed into the accelerator 180 for performing further operations.

The compiler 132 and the runtime 133 provide a fast interface between the neural network module 130 and the neural network accelerator 180. In effect, the user of the neural network model may be unaware that a portion of the model is being accelerated on the provided accelerator. For example, node values are typically propagated in a model by writing tensor values to a data structure including an identifier. The runtime 133 associates subgraph identifiers with the accelerator, and provides logic for translating the message to the accelerator, transparently writing values for weights, biases, and/or tensors to the neural network accelerator 180 without program intervention. Similarly, values that are output by the neural network accelerator 180 may be transparently sent back to the neural network module 130 with a message including an identifier of a receiving node at the server and a payload that includes values such as weights, biases, and/or tensors that are sent back to the overall neural network model.

Figure 2:
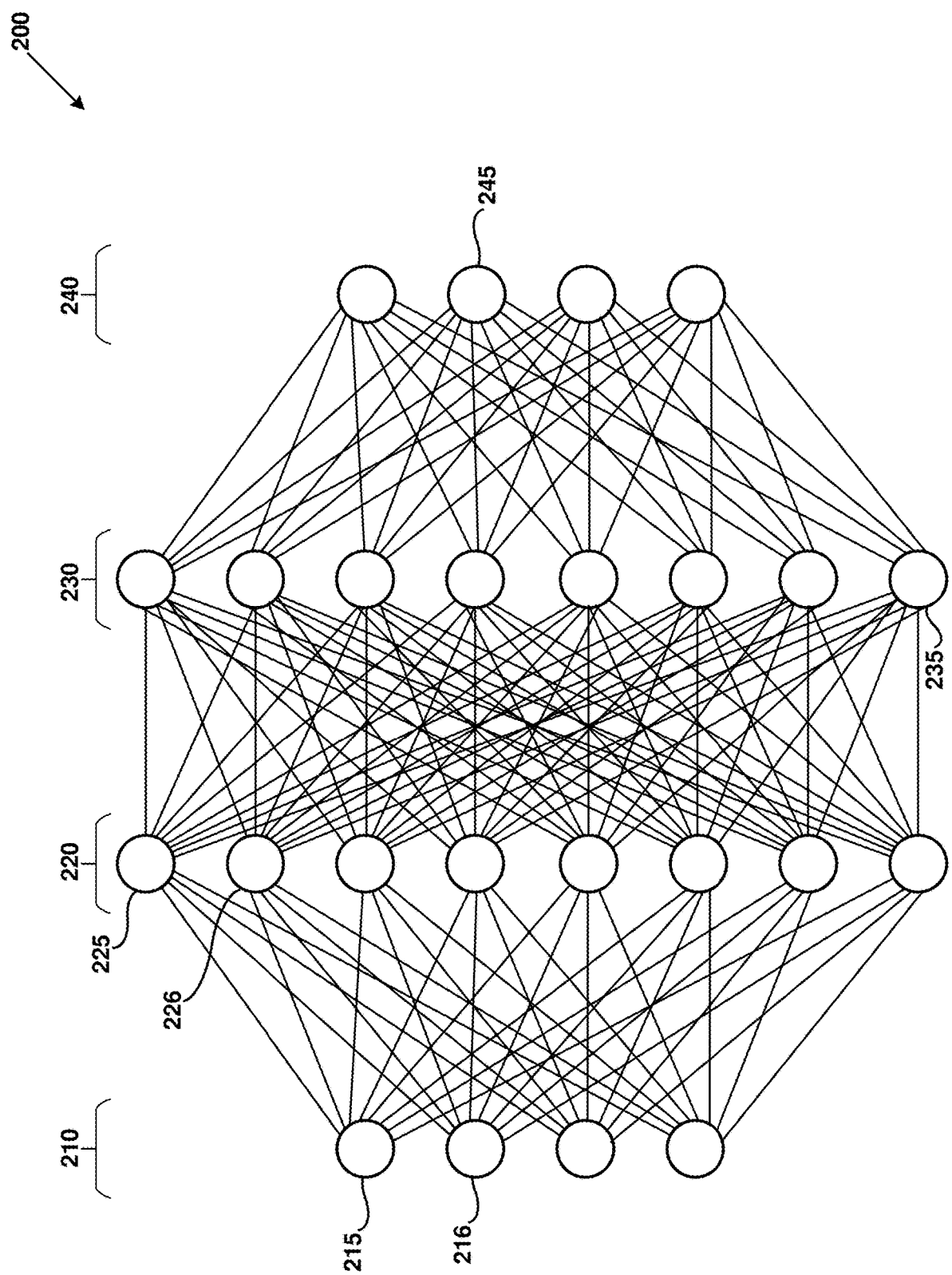
FIG. 2 is a diagram depicting an example of a deep neural network, as can be modeled using certain example methods and apparatus disclosed herein.

FIG. 2 illustrates a simplified topology of a deep neural network (DNN) 200 that can be used to perform enhanced image processing using disclosed BFP implementations. One or more processing layers can be implemented using disclosed techniques for quantized and BFP matrix/vector operations, including the use of one or more of a plurality of neural network quantization accelerators 186 in the quantization-enabled system 110 described above. It should be noted that applications of the neural network implementations disclosed herein are not limited to DNNs but can also be used with other types of neural networks, such as convolutional neural networks (CNNs), including implementations having Long Short Term Memory (LSTMs) or gated recurrent units (GRUs), or other suitable artificial neural networks that can be adapted to use BFP methods and apparatus disclosed herein.

The DNN 200 can operate in at least two different modes. Initially, the DNN 200 can be trained in a training mode and then used as a classifier in an inference mode. During the training mode, a set of training data can be applied to inputs of the DNN 200 and various parameters of the DNN 200 can be adjusted so that at the completion of training, the DNN 200 can be used as a classifier. Training includes performing forward propagation of the training input data, calculating a loss (e.g., determining a difference between an output of the DNN and the expected outputs of the DNN), and performing backward propagation through the DNN to adjust parameters (e.g., weights and biases) of the DNN 200. When an architecture of the DNN 200 is appropriate for classifying the training data, the parameters of the DNN 200 will converge and the training can complete. After training, the DNN 200 can be used in the inference mode. Specifically, training or non-training data can be applied to the inputs of the DNN 200 and forward propagated through the DNN 200 so that the input data can be classified by the DNN 200.

As shown in FIG. 2, a first set 210 of nodes (including nodes 215 and 216) form an input layer. Each node of the set 210 is connected to each node in a first hidden layer formed from a second set 220 of nodes (including nodes 225 and 226). A second hidden layer is formed from a third set 230 of nodes, including node 235. An output layer is formed from a fourth set 240 of nodes (including node 245). In example 200, the nodes of a given layer are fully interconnected to the nodes of its neighboring layer(s). In other words, a layer can include nodes that have common inputs with the other nodes of the layer and/or provide outputs to common destinations of the other nodes of the layer. In other examples, a layer can include nodes that have a subset of common inputs with the other nodes of the layer and/or provide outputs to a subset of common destinations of the other nodes of the layer.

During forward propagation, each of the nodes produces an output by applying a weight to each input generated from the preceding node and collecting the weights to produce an output value. In some examples, each individual node can have an activation function (σ) and/or a bias (b) applied. Generally, an appropriately programmed processor or FPGA can be configured to implement the nodes in the depicted neural network 200. In some example neural networks, an output function $f(n)$ of a hidden combinational node n can produce an output expressed mathematically as:

$$f(n) = \sigma\left(\sum_{i=0 \text{ to } E-1} w_i x_i + b\right) \quad \text{(Eq. 2)}$$

where $w_i$ is a weight that is applied (multiplied) to an input edge $x_i$, b is a bias value for the node n, σ is the activation function of the node n, and E is the number of input edges of the node n. In some examples, the activation function produces a continuous value (represented as a floating-point number) between 0 and 1. In some examples, the activation function produces a binary 1 or 0 value, depending on whether the summation is above or below a threshold.

A given neural network can include thousands of individual nodes and so performing all of the calculations for the nodes in normal-precision floating-point can be computationally expensive. An implementation for a more computationally expensive solution can include hardware that is larger and consumes more energy than an implementation for a less computationally expensive solution. However, performing the operations using quantized floating-point can potentially reduce the computational complexity of the neural network. A simple implementation that uses only quantized floating-point may significantly reduce the computational complexity, but the implementation may have difficulty converging during training and/or correctly classifying input data because of errors introduced by the quantization. However, quantized floating-point implementations disclosed herein can potentially increase an accuracy of some calculations while also providing the benefits of reduced complexity associated with quantized floating-point.

The DNN 200 can include nodes that perform operations in quantized floating-point. As a specific example, an output function $f(n)$ of a hidden combinational node n can produce an output expressed mathematically as:

$$f(n) = \sigma\left(Q^{-1}\left(\sum_{i=0 \text{ to } E-1} Q(w_i)Q(x_i)\right) + b\right) \quad \text{(Eq. 3)}$$

where $w_i$, is a weight that is applied (multiplied) to an input edge $x_i$, $Q(w_i)$ is the quantized floating-point value of the weight, $Q(x_i)$ is the quantized floating-point value of the input sourced from the input edge $x_i$, $Q^{-1}(\ )$ is the de-quantized representation of the quantized floating-point value of the dot product of the vectors w and x, b is a bias value for the node n, σ is the activation function of the node n, and E is the number of input edges of the node n. The computational complexity can potentially be reduced (as compared with using only normal-precision floating-point values) by performing the dot product using quantized floating-point values, and the accuracy of the output function can potentially be increased by (as compared with using only quantized floating-point values) by the other operations of the output function using normal-precision floating-point values.

Neural networks can be trained and retrained by adjusting constituent values of the output function $f(n)$. For example, by adjusting weights $w_i$, or bias values b for a node, the behavior of the neural network is adjusted by corresponding changes in the networks output tensor values. For example, a cost function C(w, b) can be used during back propagation to find suitable weights and biases for the network, where the cost function can be described mathematically as:

$$C(w, b) = \frac{1}{2n}\sum_{x} \|y(x) - a\|^2 \quad \text{(Eq. 4)}$$

where w and b represent all weights and biases, n is the number of training inputs, a is a vector of output values from the network for an input vector of training inputs x. By adjusting the network weights and biases, the cost function C can be driven to a goal value (e.g., to zero (0)) using various search techniques, for examples, stochastic gradient descent. The neural network is said to converge when the cost function C is driven to the goal value. Similar to the output function $f(n)$, the cost function can be implemented using quantized-precision computer arithmetic. For example, the vector operations can be performed using quantized floating-point values and operations, and the non-vector operations can be performed using normal-precision floating-point values.

Examples of suitable applications for such neural network BFP implementations include, but are not limited to: performing image recognition, performing speech recognition, classifying images, translating speech to text and/or to other languages, facial or other biometric recognition, natural language processing, automated language translation, query processing in search engines, automatic content selection, analyzing email and other electronic documents, relationship management, biomedical informatics, identifying candidate biomolecules, providing recommendations, or other classification and artificial intelligence tasks.

A network accelerator (such as the network accelerator 180 in FIG. 1) can be used to accelerate the computations of the DNN 200. As one example, the DNN 200 can be partitioned into different subgraphs or network layers that can be individually accelerated. As a specific example, each of the layers 210, 220, 230, and 240 can be a subgraph or layer that is accelerated, with the same or with different accelerators. The computationally expensive calculations of the layer can be performed using quantized floating-point and the less expensive calculations of the layer can be performed using normal-precision floating-point. Values can be passed from one layer to another layer using normal-precision floating-point. By accelerating a group of computations for all nodes within a layer, some of the computations can be reused and the computations performed by the layer can be reduced compared to accelerating individual nodes.

In some examples, a set of parallel multiply-accumulate (MAC) units in each convolutional layer can be used to speed up the computation. Also, parallel multiplier units can be used in the fully-connected and dense-matrix multiplication stages. A parallel set of classifiers can also be used. Such parallelization methods have the potential to speed up the computation even further at the cost of added control complexity.

As will be readily understood to one of ordinary skill in the art having the benefit of the present disclosure, the application of neural network implementations can be used for different aspects of using neural networks, whether alone or in combination or subcombination with one another. For example, disclosed implementations can be used to implement neural network training via gradient descent and/or back propagation operations for a neural network. Further, disclosed implementations can be used for evaluation of neural networks.

IV. Example Quantized Block Floating-Point Formats

Figure 3:
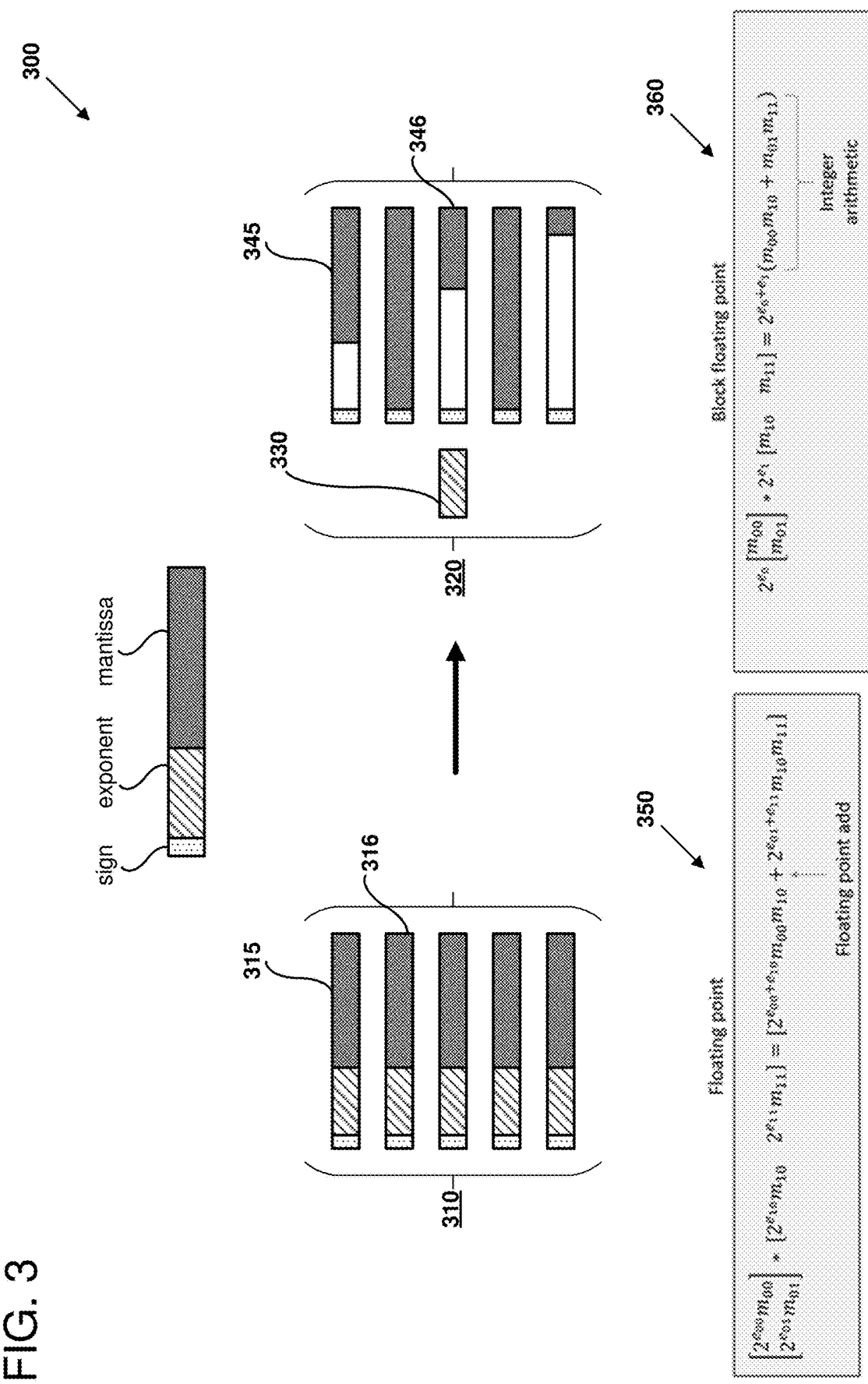
FIG. 3 is a diagram depicting certain aspects of converting a normal floating-point format to a quantized floating-point format, as can be performed in certain examples of the disclosed technology.

FIG. 3 is a diagram 300 illustrating an example of converting a normal floating-point format to a quantized, block floating-point format, as can be used in certain examples of the disclosed technology. For example, input tensors for a neural network represented as normal floating-point numbers (for example, in a 32-bit or 16-bit floating-point format) can be converted to the illustrated block floating-point format.

As shown, a number of normal floating-point format numbers 310 are represented such that each number for example number 315 or number 316 include a sign, an exponent, and a mantissa. For example, for IEEE 754 half precision floating-point format, the sign is represented using one bit, the exponent is represented using 5 bits, and the mantissa is represented using 10 bits. When the floating-point format numbers 310 in the neural network model 200 are converted to a set of quantized precision, block floating-point format numbers, there is one exponent value that is shared by all of the numbers of the illustrated set. Thus, as shown, the set of block floating-point numbers 320 are represented by a single exponent value 330, while each of the set of numbers includes a sign and a mantissa. However, since the illustrated set of numbers have different exponent values in the floating-point format, each number's respective mantissa may be shifted such that the same or a proximate number is represented in the quantized format (e.g., shifted mantissas 345 and 346).

Further, as shown in FIG. 3, use of block floating-point format can reduce computational resources required for certain common operations. In the illustrated example, a dot product of two floating-point vectors is illustrated in formal floating-point format (350) and in block floating-point format (360). For numbers represented in the normal-precision floating-point format operation 350, a floating-point addition is required to perform the dot product operation. In a dot product of floating-point vectors, the summation is performed in floating-point which can require shifts to align values with different exponents. On the other hand, for the block floating-point dot product operation 360, the product can be calculated using integer arithmetic to combine mantissa elements as shown. In other words, since the exponent portion can be factored in the block floating-point representation, multiplication and addition of the mantissas can be done entirely with fixed point or integer representations. As a result, large dynamic range for the set of numbers can be maintained with the shared exponent while reducing computational costs by using more integer arithmetic, instead of floating-point arithmetic. In some examples, operations performed by the quantization-enabled system 110 can be optimized to take advantage of block floating-point format.

In some examples, the shared exponent 330 is selected to be the largest exponent from among the original normal-precision numbers in the neural network model 200. In other examples, the shared exponent may be selected in a different manner, for example, by selecting an exponent that is a mean or median of the normal floating-point exponents, or by selecting an exponent to maximize dynamic range of values stored in the mantissas when their numbers are converted to the quantized number format. It should be noted that some bits of the quantized mantissas may be lost if the shared exponent and the value's original floating-point exponent are not the same. This occurs because the mantissa is shifted to correspond to the new, shared exponent.

There are several possible choices for which values in a block floating-point tensor will share an exponent. The simplest choice is for an entire matrix or vector to share an exponent. However, sharing an exponent over a finer granularity can reduce errors because it increases the likelihood of BFP numbers using a shared exponent that is closer to their original normal floating-point format exponent. Thus, loss of precision due to dropping mantissa bits (when shifting the mantissa to correspond to a shared exponent) can be reduced.

For example, consider multiplying a row-vector x by matrix W: y=xW. If an exponent is shared for each column of W, then each dot-product $xW_j$ (where $W_j$ is the j-th column of W) only involves one shared exponent for x and one shared exponent for $W_j$.

Figure 5:
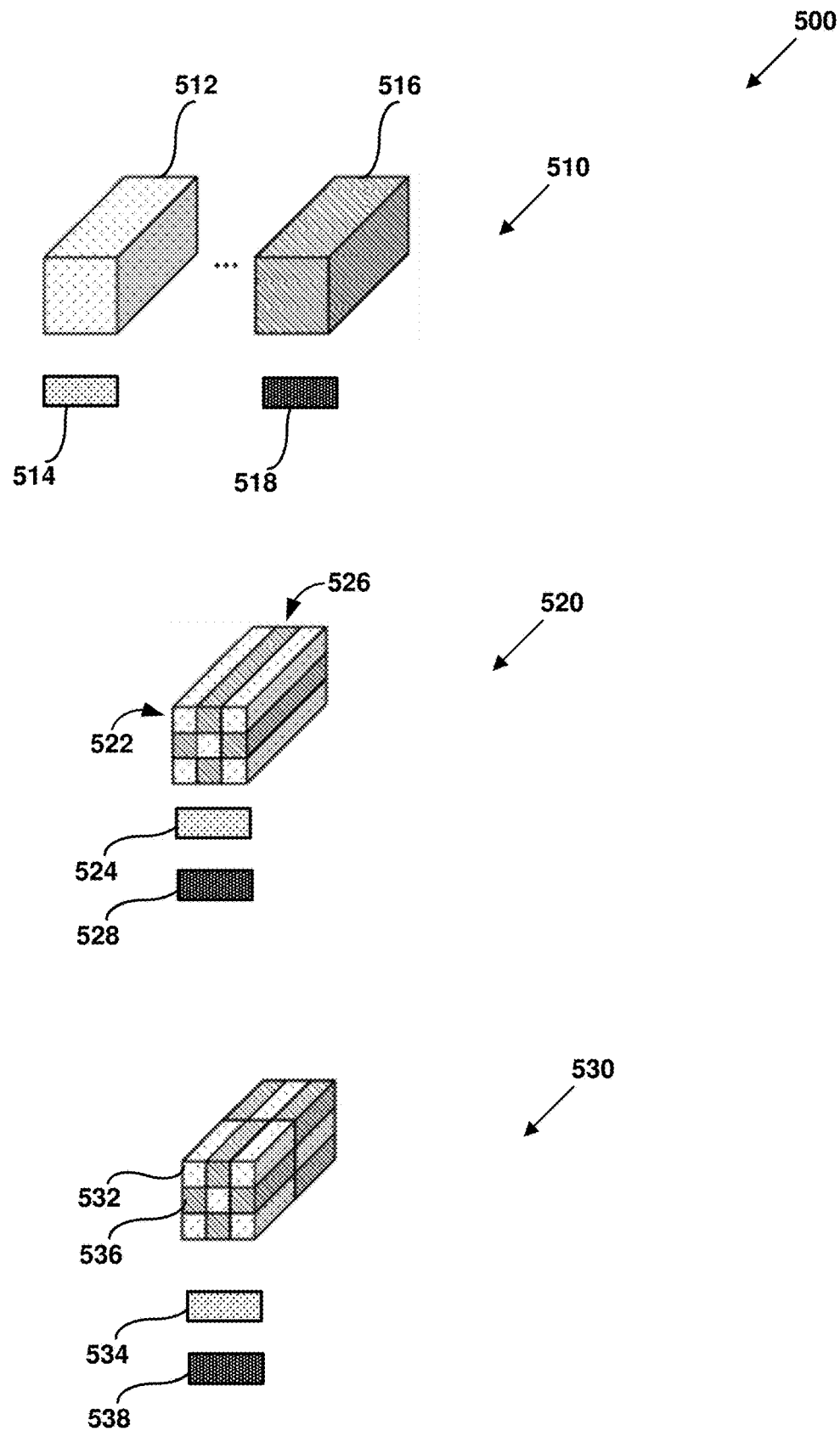
FIG. 5 depicts a number of example block floating-point formats that can be used to represent quantized neural network models, as can be used in certain examples of the disclosed technology.

FIGS. 4 and 5 illustrate alternative block floating-point formats that can be used for computation of neural networks. In the context of neural nets, a core operation is to perform a dot product. For example, dot products are the core computation of matrix multiplication and convolutions. Matrix multiplication involves dot products of the rows/columns of the matrix with an input vector. Convolutions involve dot products of filters with windows of the input. In the context of quantized floating-point, the group of values selected to share an exponent can have an impact on the complexity of the computer arithmetic logic used for calculating the dot product. The values sharing an exponent can be referred to as the values within a bounding box. The shape of bounding boxes can potentially impact quantization error and computation cost. While clustering similar magnitude values to create bounding boxes can reduce quantization error, tracking scaling factors for arbitrary bounding box shapes may be expensive. Instead, matrices and filters can be partitioned into bounding boxes that are potentially more efficient for the operations performed by a neural network. Specifically, an appropriate selection of the bounding box can reduce the complexity of computer arithmetic circuits that are used to implement the operations of the neural network. FIG. 4 illustrates block floating-point formats that may be well suited for matrices and FIG. 5 illustrates block floating-point formats that may be well suited for convolution filters.

FIG. 4 is a diagram 400 illustrating four alternative block floating-point formats, as can be used in certain examples of the disclosed technology. As shown, a first format 410 represents an entire array 420 of values that share a single exponent 425. In other words, the entire array 420 of values is encapsulated within a single bounding box.

In a second format 430, a common exponent is shared on a per-column basis. In other words, the columns of the matrix are the bounding box for the values. Thus, in this particular example, block floating-point values stored in even columns 431 of a matrix each share a first, single exponent 432. Block floating-point values stored in odd columns 435 each share a second, single exponent 437. In other examples, each column of an array can be associated with a different shared exponent. For an eleven-column tile in the alternative format, there can be eleven corresponding shared exponents, one shared exponent per column. In other examples, each row of an array can be associated with a different shared exponent, or odd and even rows can be associated with a shared common exponent.

A third format 450 is shown where groups of elements in an array share a common exponent. For example, if a 15×15 matrix of values shares in exponent according to the third format 450, a first set of 5×5 element groups 455 and 456 share a single shared exponent 458. Similarly, a second 5×5 element group of elements in the array 460 and 461 can each shared a second single exponent 468. In other examples, each of the tiles can be associated with its own respective shared exponent. In the example format 450, there could be nine shared exponents for the 15×15 matrix.

A fourth format 470 is shown where two shared exponents are shared on a tiling plus per-column basis. Thus, a first set of numbers including numbers 480, 481, and 485 all share a single common exponent 488. Similarly, a second set of numbers including a set 490 and 491 each share a second, different single exponent 495. In an alternative example, each of the groups shown can have its own shared exponent.

In some examples, the computational cost of matrix-vector multiplication can be further reduced by reducing mantissa widths. A large range of values having a shared common exponent can be expressed with only a few bits of mantissa. for example, in a representation with 4 bits of mantissa and a 5-bit exponent, values can be expressed in a range $[2^{-14}0.001_2, 2^{15}1.111_2]$, or approximately $[2^{-17}, 2^{16}]$. in contrast, a 4-bit fixed point number can only represent values in the range $[0001_2, 1111_2]$, or approximately $[2^0, 2^4]$.

FIG. 5 is a diagram 500 illustrating three alternative block floating-point formats, as can be used in certain examples of the disclosed technology. These formats may be useful for two-dimensional convolutions, but the formats can be generalized to higher-dimensional convolutions as well. As shown, a first format 510 represents an entire convolution filter 512 of values that share a single exponent 514. A different convolution filter 516 of values can share a single exponent 518. Thus, the format 510 illustrates that an entire convolution filter can be a bounding box of the values.

In a second format 520, each spatial pixel can be a bounding box so that a common exponent is shared on a per-spatial-pixel basis, along the channel dimension. As shown, the spatial pixel values 522 share a single exponent 524 and the spatial pixel values 526 share a single exponent 528. For example, for an input with dimensions $[x, y, c_i]$, each spatial dimension x and y can define a bounding box with $c_i$ values. Similarly, for $c_o$ convolution filters of dimension $[f_x, f_y, c_i]$, each pixel $(f_x, f_y)$ for each of the $c_o$ filters can be a separate bounding box with $c_i$ values. The bounding box size for this approach is $c_i$.

In a third format 530, each spatial pixel can be sub-divided along the channel dimension so that a bounding box includes a sub-division of a spatial pixel. As shown, the sub-divided spatial pixel values 532 share a single exponent 534 and the sub-divided spatial pixel values 536 share a single exponent 538. For small $c_i$, the cost of handling the scaling factor can be significant. For example, input images at the first layer of deep convolutional neural nets may have $c_i=3$ corresponding to 3 color channels. Tracking a scaling factor for every triplet can be expensive. In this case, the convolution can be re-shaped into a matrix-matrix multiplication to increase the bounding box and decrease the expense of tracking the bounding box. For example, each convolution filter can be flattened to create a matrix W with $c_o$ columns and $f_x * f_y * c_i$ rows. An input matrix X can be created where each row is a $f_x * f_y * c_i$ vector corresponding to a window of the input that the convolution filter sweeps over. The result Y=XW is a matrix that can be re-shaped to match the output of the convolution operation. With the convolution re-formulated as matrix multiplication, the bounding box strategies discussed above in reference to FIG. 4 for matrix multiplication can be applied.

V. Example Methods of Neural Network Training

Figure 6:
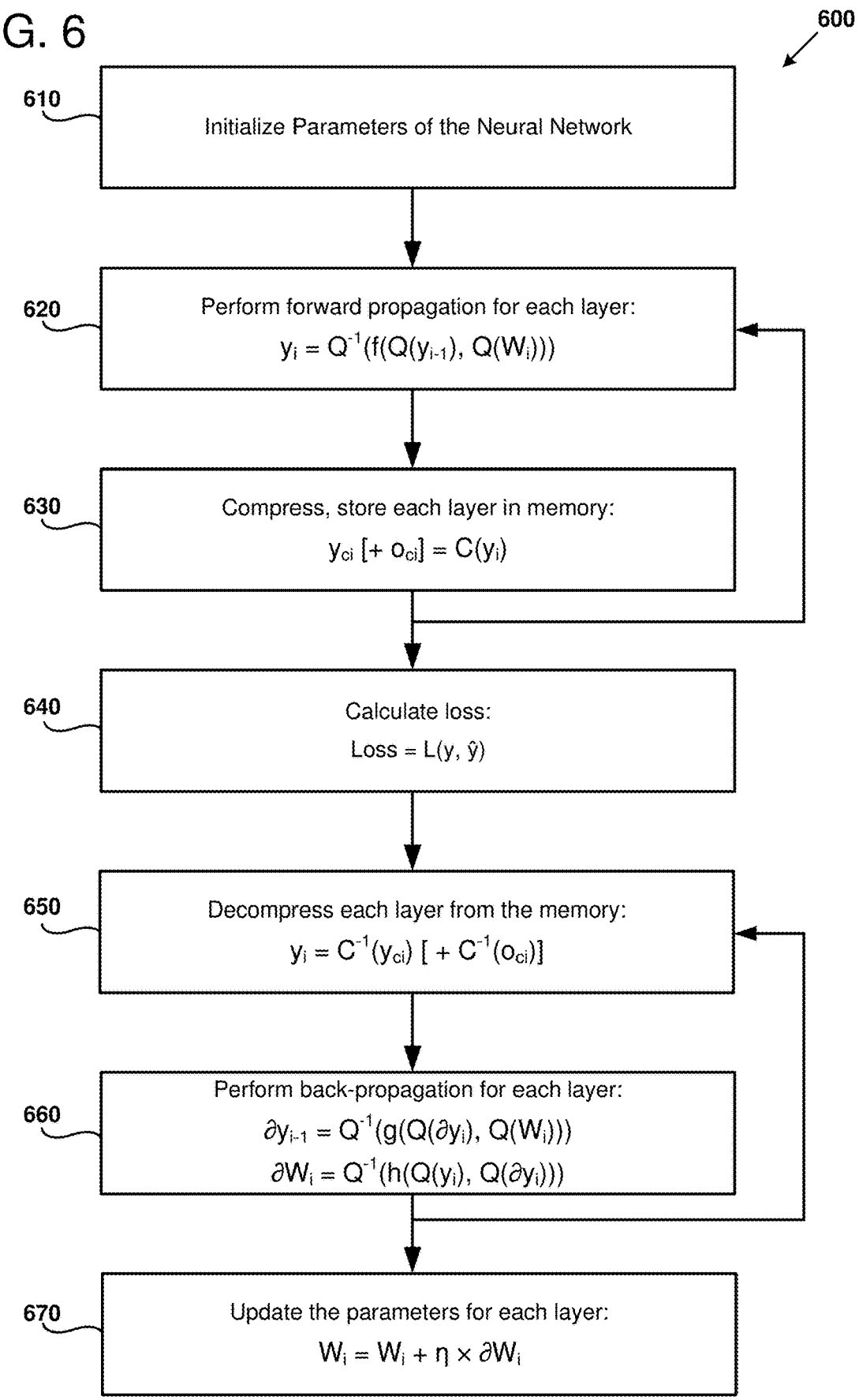
FIG. 6 is a flow chart depicting an example method of training a neural network for use with a quantized model having outlier values, as can be implemented in certain examples of the disclosed technology.

FIG. 6 is a flow diagram depicting a method 600 of training a neural network using a quantized model with an outlier block floating-point format, as can be implemented in certain examples of the disclosed technology. For example, training the neural network can include iterating through a set of training data, where the method 600 is used for updating the parameters of the neural network during a given iteration of training data. As one example, the method 600 can be performed by a quantization-enabled system, such as the quantization-enabled system 110 of FIG. 1.

At process block 610, parameters, such as weights and biases, of the neural network can be initialized. As one example, the weights and biases can be initialized to random normal-precision floating-point values. As another example, the weights and biases can be initialized to normal-precision floating-point values that were calculated from an earlier training set. The initial parameters can be stored in a memory or storage of the quantization-enabled system. In one example, the parameters can be stored as quantized floating-point values which can reduce an amount storage used for storing the initial parameters.

At process block 620, input values of the neural network can be forward propagated through the neural network. Input values of a given layer of the neural network can be an output of another layer of the neural network. The values can be passed between the layers from an output of one layer to an input of the next layer using normal-precision floating-point. The output function of the layer i can include a term that is described mathematically as:

$$y_i = Q^{-1}(f(Q(y_{i-1}), Q(W_i)))$$ (Eq. 5)

where $y_{i-1}$ is the output from a layer providing the input to layer i, $W_i$ is the weight tensor for the layer i, $f(\ )$ is a forward function of the layer, $Q(\ )$ is a quantization function, and $Q^{-1}(\ )$ is a de-quantization function. The output function of the layer can be the de-quantized representation of $f(\ )$, or alternatively, the output function can include additional terms, such as an activation function or the addition of a bias, that are performed using normal-precision floating-point (after de-quantization) or using quantized floating-point (before de-quantization). Generally, the inputs, outputs, and parameters of the layers are tensors. Typically, the inputs, outputs, and parameters of the layers will be vectors or matrices. The quantization function converts normal-precision floating-point values to quantized floating-point values. The quantization function can be selected to account for the type of input data and the types of operations performed by the layer i. For example, when $y_i$ and $W_i$ are two-dimensional matrices and the output function includes a term that takes the cross product of $y_{i-1}$ and $W_i$, the quantization function for $y_{i-1}$ can use a bounding box including a row or a portion of a row of $Y_{i-1}$, and the quantization function for $W_i$ can use a bounding box including a column or a portion of a column of $W_i$. The computation can be more efficient when selecting the bounding boxes to follow the flow of the operators, thus making a hardware implementation smaller, faster, and more energy efficient. The de-quantization function converts quantized floating-point values to normal-precision floating-point values. In some examples, the quantization function Q( ) and dequantization function $Q^{-1}$( ) are ommitted, and forward propagation is formed in a normal-precision floating-point format.

At process block 630, a portion of a neural network, such as a layer that was just forward propagated to the next layer of the neural network can be compressed and stored in memory. For example, activation values calculated as part of forward propagation as discussed above process block 620 can be compressed and stored in the memory. This compression can be expressed mathematically as:

$$y_{ci}[+o_{ci}]=C(Q2(y_i)) \quad (Eq.\ 6a)$$

or $$y_{ci}[+o_{ci}]=C(Q2(f(Q(y_{i-1}),Q(W_i)))) \quad (Eq.\ 6b)$$

where $y_i$ are the values generated by forward propagation for a layer at process block 620, C( ) is an optional, additional compression function (which may include multiple compression operations), Q2( ) is a quantization function to a second block floating-point format, $y_{ci}$ are compressed values to be stored in memory, and $o_{ci}$ are outlier values for some (but not all) of the activation values. As will be discussed below, the outlier values are generated for a selected subset of all the activation values, and stored in ancillary storage to the compressed activation values. In block floating-point format, the compressed values $y_{ci}$ share a common exponent, and the outlier values $o_{ci}$ can add more significant bits (boosting the expressible range for those activation values) or precision than for non-outlier compressed values. For example, when a few of the activation values are substantially larger than the others, these can be selected as outlier values to have additional information stored in ancillary storage when compressed.

In some examples, the Q2( ) quantization function translates values from a normal precision format to a smaller quantized format than used in the quantized layer (as in equation 6a). In other examples, the Q2( ) quantization function translates values directly from the first block floating-point format used in the quantized layer to a second block floating-point format (as in equation 6b). The compressed activation values are expressed in a second block floating-point format that can differ from a first block floating-point format used to perform forward propagation calculations in at least one of the following ways: having a different mantissa format, having a different exponent format, or having a different exponent sharing scheme. For example, if forward propagation was performed using activation values expressed in an 8-bit format, these values can be transformed to a 4-bit format by truncating or rounding the mantissa. As another example, activation value exponents, including shared exponents in BBFP format can be transformed from a 7-bit format to a 5-bit format. Values can be translated between the two quantized formats used by any suitable technique. For example, truncation or rounding of exponents, along with any mantissa shifting performed to compensate for adjusted exponents can be performed. In some examples, table lookups or other techniques can be used to perform the translation.

In some examples, the compressed block floating-point format values $y_{ci}$ share a common exponent in a different way than the format used when performing forward propagation. Aspects of the sharing format that can be changed include how an exponent is shared on a per-row, per-column, or per-tile basis. In some examples, the outlier values $o_{ci}$ may also be expressed in a block-floating point format with at least one shared exponent. In other examples, each of the outlier values $o_{ci}$ has its own individual exponent. In some examples, additional compression can be applied to the compressed block floating-point format prior to storing in memory. Examples of suitable techniques for further compressing activation values in the compressed quantized format include entropy compression (e.g., Huffman encoding), zero compression, run length compression, compressed sparse row compression, or compressed sparse column compression.

At process block 640, a loss of the neural network can be calculated. For example, the output y of the neural network can be compared to an expected output ŷ of the neural network. A difference between the output and the expected output can be an input to a cost function that is used to update the parameters of the neural network.

At process block 650, activation values stored in memory are decompressed for back propagation, and in particular, for calculation of output error terms used in backpropagation for a particular layer. The method can iterate over each layer and decompress activation values for each layer, perform back-propagation for the layer, and then decompress activation values for the preceding layer. This decompression can be expressed mathematically as:

$$y_i=Q2^{-1}(C^{-1}(y_{ci}))[+Q2^{-1}(C^{-1}(o_{ci}))] \quad (Eq.\ 7a)$$

or $$y_i=C^{-1}(y_{ci})[+C^{-1}(o_{ci})] \quad (Eq.\ 7b)$$

where $y_{ci}$ are the compressed values retrieved from memory, $o_{ci}$ are the outlier values retrieved from memory, $C^{-1}$( ) is an optional decompression function (which may include multiple compression operations) that is inverse of the optional compression function C( ), $Q2^1$( ) is a function that translates quantized values from the second block floating-point format to the first block floating-point format, and $y_i$ are the values generated by forward propagation for a layer at process block 620. For example, after forward propagation is completed for every layer and a neural network as discussed above regarding process blocks 620 and 630, and losses calculated as discussed above at process block 640, values are back propagated back through the neural network, typically starting from the output layer of the neural network. Thus, depending on how the compressed quantized format is different than the format used for back propagation, and appropriate transformation of activation value mantissas, exponents, and/or exponent sharing scheme can be performed. Further, if additional compression was applied prior to storing in memory, such as entropy compression, zero compression, run length encoding, compressed sparse row compression, or compressed sparse column compression, these operations can be reversed prior to performing back propagation for a layer at process block 660.

At process block 660, the loss of the neural network can be back-propagated through the neural network. During back propagation, an output error term ∂y and a weight error term ∂W can be calculated. The output error term can be described mathematically as:

$$\partial y_{i-1} = Q^{-1}(g(Q(\partial y_i), Q(W_i))) \quad \text{(Eq. 8)}$$

where $\partial y_{i-1}$ is the output error term from a layer following layer i, $W_i$ is the weight tensor for the layer i, g( ) is a backward function of the layer, Q( ) is a quantization function, and $Q^{-1}$( ) is a de-quantization function. The backward function g( ) can be can be the backward function of f( ) for a gradient with respect to $y_{i-1}$ or a portion of the gradient function. The output error term of the layer can be the de-quantized representation of g( ) or the output error term can include additional terms that are performed using normal-precision floating-point (after de-quantization) or using quantized floating-point (before de-quantization).

The weight error term ∂W can be described mathematically as:

$$\partial W_i = Q^{-1}(h(Q(y_i), Q(\partial y_i))) \quad \text{(Eq. 9)}$$

where $\partial W_i$ is the weight error term for the layer i, $\partial y_i$ is the output error term for the layer i, $y_i$ is the output for the layer i, h( ) is a backward function of the layer, Q( ) is a quantization function, and $Q^{-1}$( ) is an inverse quantization function. The backward function h( ) can be can be the backward function of f( ) for a gradient with respect to $W_{i-1}$ or a portion of the weight error equation 9. The weight error term of the layer can be the de-quantized representation of h( ) or the weight error term can include additional terms that are performed using normal-precision floating-point (after de-quantization) or using quantized floating-point (before de-quantization). The weight error term can include additional terms that are performed using normal-precision floating-point.

At process block 670, the parameters for each layer can be updated. For example, the weights for each layer can be updated by calculating new weights based on the iteration of training. As one example, a weight update function can be described mathematically as:

$$W_i = W_i + \eta \times \partial W_i \quad \text{(Eq. 10)}$$

where $\partial W_i$ is the weight error term for the layer i, η is the learning rate for the layer i for the neural network, $W_i$ is the weight tensor for the layer i. In one example, the weight update function can be performed using normal-precision floating-point.

Figure 7:
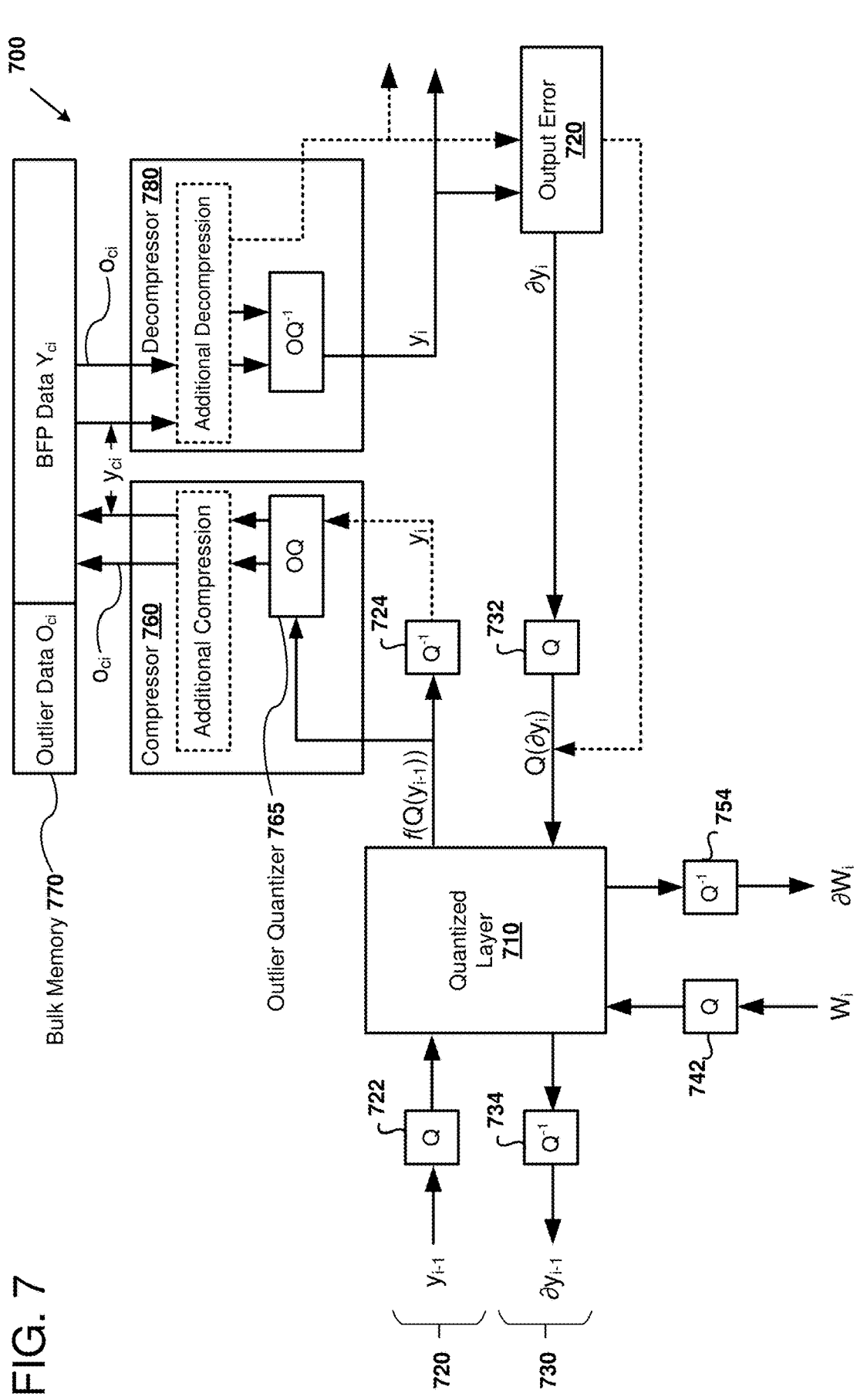
FIG. 7 is a block diagram depicting an example environment for implementing activation compression with narrow block floating-point formats having outlier values, as can be implemented in certain examples of the disclosed technology.

VI. Example Environment for Performing Activation Compression Using Narrow Block Floating-Point FIG. 7 is a block diagram 700 depicting an example of a suitable environment for performing activation compression and associated floating-point operations between a normal-precision floating-point domain, quantized floating-point domain, and compressed, quantized floating-point domain including outlier values. As described above, more computationally expensive operations such as vector-vector, vector-matrix, matrix-matrix, and convolution operations can be performed by the quantized layer 710 in the quantized floating-point domain. Less computationally expensive operations such as scalar add and scalar multiply can be performed outside of the quantized layer 710 in the normal-precision floating-point domain. With regard to neural networks, a neural network can be partitioned into layers (such as quantized layer 710). For the back propagation portion of training, an error output component 720 can receive the activation values and use additional functions, such as an error function or an objective function, to calculate the output error term $\partial y_i$. In some examples, the output error terms $\partial y_i$ are calculated in a normal-precision floating-point domain, as shown by the solid lines to the output error component 720. In other examples, the output error component 720 calculates the error output terms in a block floating-point format.

The bulk of the computational work within a layer can be performed in the quantized floating-point domain and less computationally expensive operations of the layer, such as adding a bias value or calculating an activation function, can be performed in the normal-precision floating-point domain. The values that interface between the layers can be passed from one layer to the other layer in the normal-precision floating-point domain. By quantizing the inputs specifically for a given layer, the quantization can be targeted to the operations of that layer so that the operations of the layer are more efficient. Specifically, bounding boxes of the quantized floating-point format can be selected to reduce the complexity of the computer arithmetic circuits to make the computer logic potentially faster and/or more energy efficient.

As one example, the output values $y_i$, the output error term $\partial y_i$, the weights $W_i$, and the weight error terms $\partial W_i$ for a given layer can be stored in the normal-precision floating-point domain. During the forward propagation flow, the output values from an earlier layer can be communicated from the normal-precision floating-point domain to the quantized floating-point domain through the quantizer 722 that converts from normal-precision floating-point to quantized floating-point. The output values from the given layer can be communicated from the quantized floating-point domain to the normal-precision floating-point domain through the de-quantizer 724 that converts from quantized floating-point to normal-precision floating-point. The weights for the given layer can be communicated from the normal-precision floating-point domain to the quantized floating-point domain through the quantizer 742. The de-quantized values $y_i$ or the quantized values $Q^{-1}(y_i)$ can be sent to a compressor 760, which compresses the values before they are stored in a bulk memory 770.

The compressor 760 can be a block floating-point compressor, or provide other forms of compression to reduce the amount of data stored in the bulk memory 770. In such examples, the second block floating-point format has a lower precision mantissa than the first block floating-point format used to represent values during quantized layer 710 operations. For example, the first block floating-point format used in the quantized layer 710 may have mantissas having more bits than the second block floating-point format, for example: four, five, six, seven, or eight bits; and the second block floating-point format may have mantissas having fewer bits than the first block floating-point format, for example: three, four, four or five, five or six, or four to six bits, respectively. In the example discussed below, the first block floating point format has six-bit mantissas and the second block floating-point format has four-bit mantissas. It should be readily understood to one of ordinary skill in the relevant art having the benefit of the present disclosure that foregoing recited combinations of particular numbers of bits in the first block floating-point format and a second block floating-point format are merely preferred examples, but that other combinations of precision of mantissa format may be used in other examples.

The compressor 760 includes an outlier quantizer 765 that identifies some, but not all of, the activation values as being outliers. The outlier quantizer 765 can include an outlier selector that determines a shared exponent for the compressed activation values. For example, the selector can identify a shared exponent by determining at least one of a mean (average), a median, and/or a mode for at least a portion of the activation values. In some examples, the selector can identify a shared exponent by identifying a group of largest outlying values in the set of activation values and for the remaining group of activation values not identified to be in the group of the largest outliers, determining a shared exponent by selecting the largest exponent of the remaining group. In some examples, the exponent used by the largest number of activation values is selected as the shared exponent. The outlier quantizer 765 also identifies a limited number of the activation values as having outlier values. Those activation values having outlier values will have additional data stored to increase precision and or allow for larger or more precise values to be stored for those particular activation values. For example, a predetermined number of the largest values in the set of activation values can be determined to be outliers. As a non-limiting example, the largest 8 out of 256 values can be selected as outlier activation values. The selected largest eight values will have a second outlier value mantissa and an associated exponent that can be combined when decompressing the compressed outlier activation value.

The number of outlier values can be selected based on performance or hardware attributes. Generally, storing fewer activation values with outlier values decreases storage costs, while storing more activation values with outlier values increases precision of the neural network. In some examples, a predetermined number (e.g., one or a few) of activation values having a shared exponent are stored with outlier values. In some examples, the number of activation values stored with outlier values is determined per memory access. For example, if 128 activation values are stored per memory access, then a predetermined number (e.g., one or a few) of activation values having outlier values are stored per each memory access. In some examples, the number of activation values stored with outlier values is predetermined based on computation granularity. For example, if 16 activation values are generated for a given unit of computation (e.g., a single clock cycle, or a predetermined number of clock cycles), then a predetermined number (e.g., one or a few) of activation values having outlier values are stored per compute cycle.

In some examples, the second block floating-point format has a same or greater precision exponent than the first block floating-point format. In some examples, the second block floating-point format has a lower precision exponent than the first block floating-point format. In some examples, the first block floating-point format uses a sharing format that is different than the sharing format for a common exponent of the second block floating-point format. For example, the sharing format can be different based on per-row, per-column, or per-tile sharing of a common exponent for the compressed activation values. The precision of the second block floating-point format can be adjusted in a number of different ways, including rounding, truncation, and/or shifting of mantissa values.

In the illustrated example, the activation values can alternatively be dequantized 724 to a normal precision format prior to converting to the second block-floating-point format and storing in the bulk memory 770. In some examples, the compressor 760 is configured to further compress activation values in the second block floating-point format by performing at least one or more of the following compression operations: entropy compression, zero compression, run length encoding, compressed sparse row compression, or compressed sparse column compression. In some examples, block floating-point data for the activation values $y_{ci}$ is stored in the same general area of the bulk memory 770 as the outlier data $o_{ci}$. In other examples, different memory units and/or different types of memory units are used to store the activation value data $y_{ci}$ and the outlier value data $o_{ci}$. The outlier data $o_{ci}$ can further include index information indicating which of the activation values the outlier values are associated with, and in some examples an individual exponent for each of the outlier values. In other examples, the outlier values $o_{ci}$ can share an exponent, similar to other block floating-point formats.

The bulk memory 770 can be implemented using any suitable memory or storage technology. In some examples, memory storing temporary values in the quantization layer 710 is typically implemented as static ram (SRAM), embedded dynamic RAM (eDRAM), in a register file, in a block RAM, or other suitable structure, while the bulk memory 770 is typically implemented in memory structures supporting larger, but often slower access, for example off-chip DRAM, network accessible RAM, SSD drives, hard drives, or network-accessible storage. As will be readily understood to one of ordinary skill in the art having the benefit of the present disclosure, the types and arrangement of memory used to implement memory for the quantization layer 710 and the bulk memory 770 can be selected depending on desired performance attributes such as costs, energy, and speed.

A decompressor 780 reads the compressed activation values from the bulk memory 770 and reverses the operations performed by the compressor 760. In examples where additional compression is applied to the quantized values, the values are decompressed. The values can then be translated from the second block floating-point format to a normal precision floating-point format. The decompressor 780 includes an outlier dequantizer 785 that transforms values from the second block floating-point format back to the first block floating-point format or a normal precision floating-point format. For those activation values having an associated outlier value, the outlier dequantizer 785 identifies such values using an outlier index and combines the stored outlier value $o_{ci}$ with the block floating-point data $y_{ci}$ (e.g., by adding the two values) to restore the respective activation value. In alternative examples, the values are output by the decompressor 780 in a quantized block floating-point format, as indicated by the dashed line.

The output error component 720 can receive activation values in normal precision floating-point format (as in equation 6a). In alternative examples, the output error component 720 can receive activation values in a quantized floating-point format (as in equation 6b), such as the second block floating-point format, as indicated by the dashed line. The output error component 720 calculates the derivative of the activation value which is used in back propagation. The back propagation is performed using the quantized layer 710 as indicated in the diagram 700.

The dashed arrows in the diagram 700 depict an alternative path for compressing and decompressing activation values. As shown, as successive layers of a neural network are forward propagated, producing first activation values in a first block floating-point format, the compressor can convert the quantized activation values to a normal-precision floating-point format prior to converting to a second block floating-point format, thereby producing compressed activation values.

During the back-propagation flow 730, the output error terms from a later layer can be communicated from the normal-precision floating-point domain to the quantized floating-point domain through the quantizer 732. The output error term from the given layer can be communicated from the quantized floating-point domain to the normal-precision floating-point domain through the de-quantizer 734. The weights for the given layer can be communicated from the normal-precision floating-point domain to the quantized floating-point domain through the quantizer 742. The weight error term error term from the given layer can be communicated from the quantized floating-point domain to the normal-precision floating-point domain through the de-quantizer 754. As back propagation proceeds, quantized activation values in the second block floating-point format are either are converted from the second block floating-point format used to store the activation values in the bulk memory 770 to the first block floating-point format used by the quantized layer 710 or alternatively, converted to a normal precision format and translated to the first block floating-point format through the quantizer 732. Further, in examples where additional compression (e.g., entropy coding, zero encoding, or other additional compression scheme) is applied prior to storing in the bulk memory 770, the data can be further decompressed before the quantizing.

Figure 8:
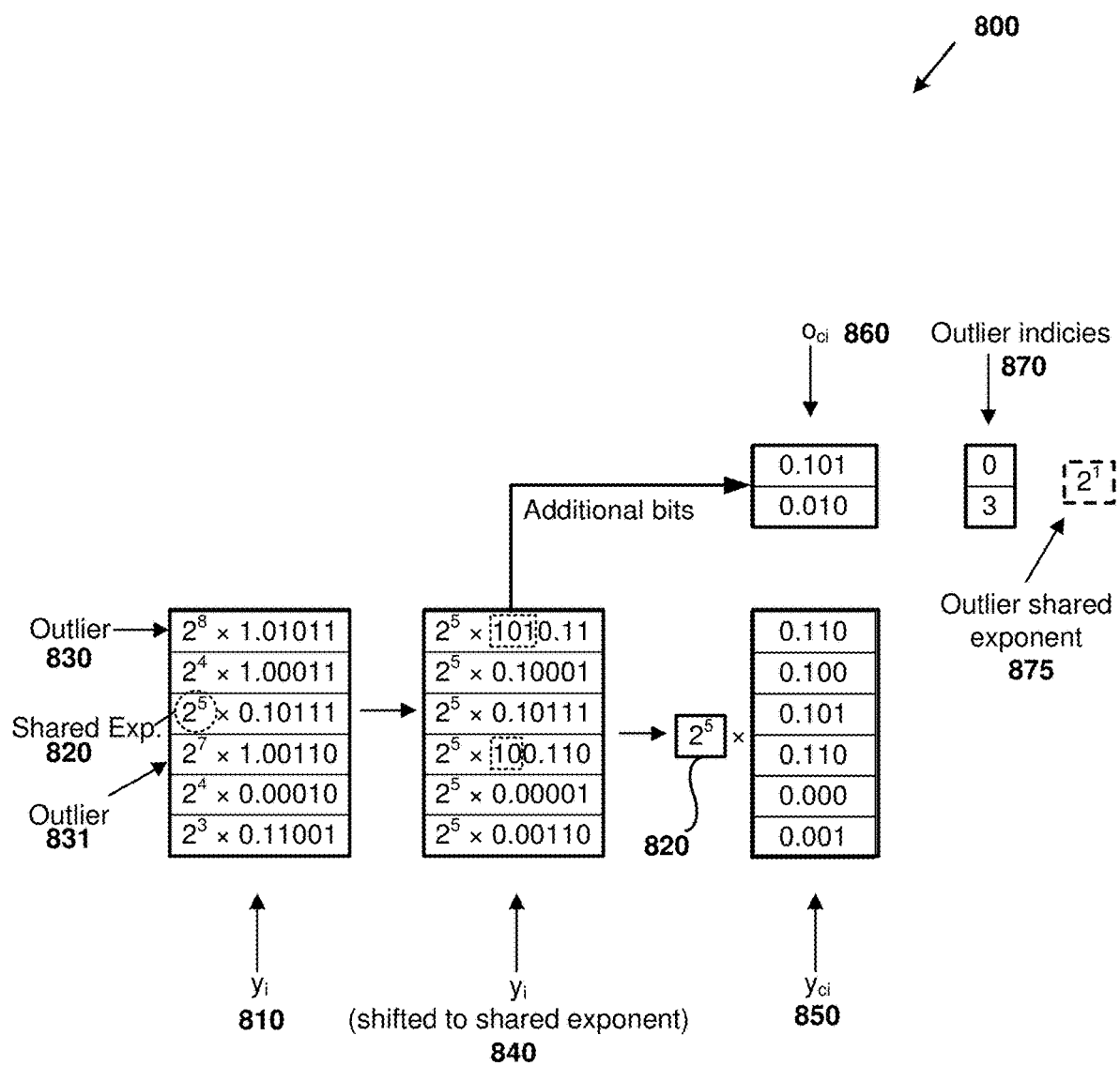
FIG. 8 is block diagram depicting an example of a subset of data used in activation compression with outlier values, as can be implemented in certain examples of the disclosed technology.

FIG. 8 is a diagram 800 illustrating an example of converting activation values to a second block floating-point format having outlier values for selected activation values. For example, a quantization system 110 as discussed above including use of a compression environment 700 can be used to perform the illustrated operations.

As shown in FIG. 8, a set of activation values $y_i$ 810 is received. Each of the set of activation values has an individual exponent and a six-bit mantissa. A shared exponent $2^5$, is selected by analyzing the set of activation values. In this particular example, it is determined that using the selected the shared exponent $2^5$ 820 will allow expression of the most number of activation values 810 without loss of an unacceptable amount of data. Two outlier activation values 830 and 831 are also identified that are substantially larger than other values in the set of activation values. These two outlier activation values will have ancillary outlier data stored, allow for larger values than those that can be expressed using the shared exponent 820.

Mantissas for all of the activation values 810 are shifted 840 based on the shared exponent 820. For all of the compressed activation values, as set of truncated, N-bit block floating-point mantissas $y_{ci}$ 850 (in the illustrated example, four bits) is generated for the portions of the shifted mantissas 840 associated with the shared exponent 820, for both non-outliers and outlier activation values. For the two outlier activation values, another N additional bits of mantissa values 860 (in the illustrated example, four bits) and one of a number of outlier indices 870 are generated for each outlier value $o_{ci}$. The exponent associated with each outlier value can be determined a number of different ways. In some examples, the outlier value mantissas 860 are simply a predetermined number of bits of mantissa to the left of the bits of mantissa for all of the activation values. In other words, the next N more significant bits of mantissa are selected as the outlier value mantissas. In some examples, the outlier value mantissas are associated with a shared exponent for two or more of the outlier values. In some examples, each of the outlier value mantissas 860 is associated with an individual exponent. In the illustrated example, the outlier values share the same outlier exponent $2^1$ 875. Each of the outlier indices 870 indicates which activation value the respective outlier mantissa is associated with. The illustrated example, the outlier values are associated with the activation values from rows 0 and 3. Thus, by storing an index for each of the outlier values, memory is only used to store additional bits of mantissa for those activation values that have an outlier value.

Figure 9:
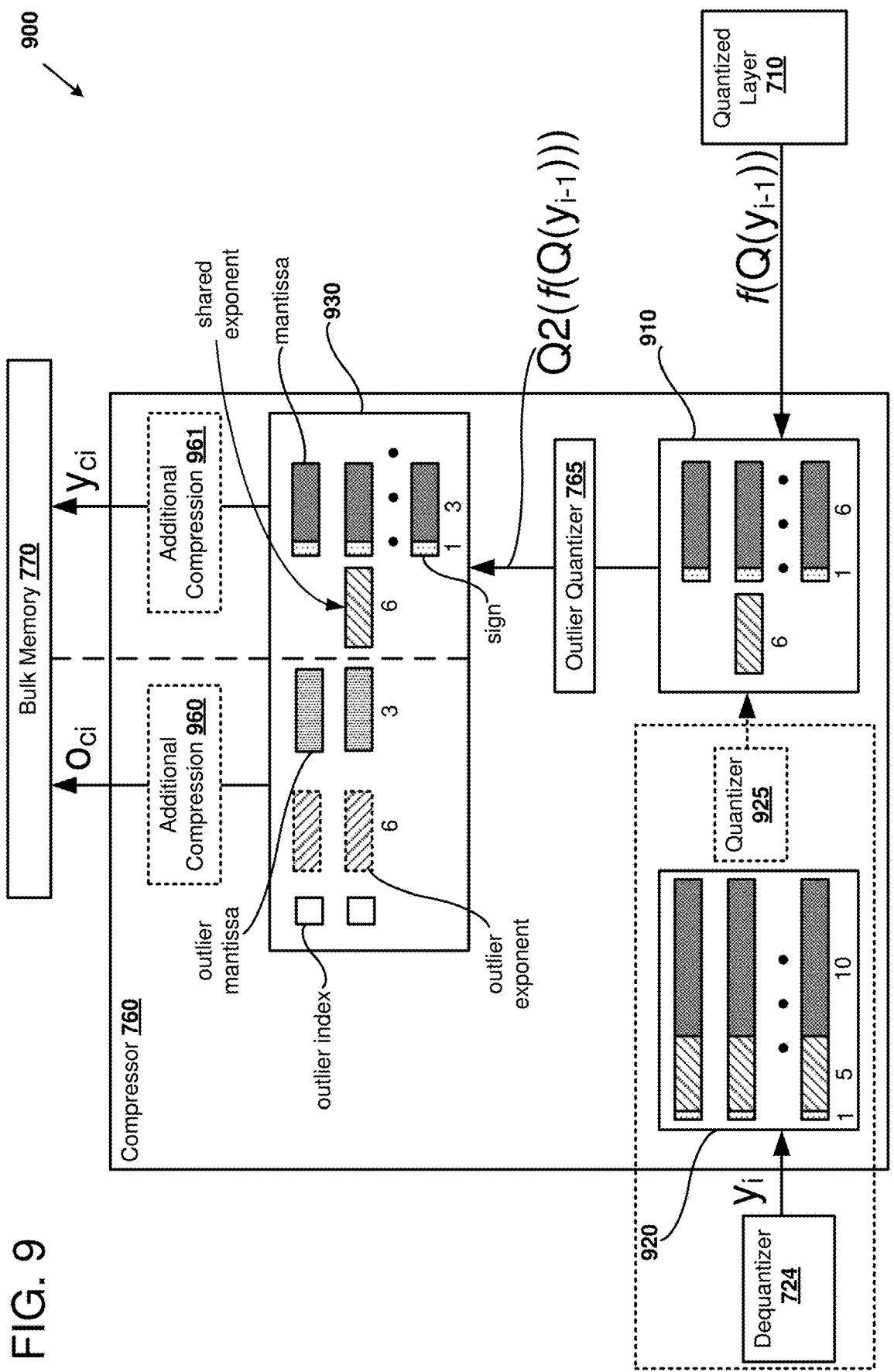
FIG. 9 is a block diagram depicting an example of performing activation compression with outlier values, as can be performed in certain examples of the disclosed technology.

FIG. 9 is a diagram 900 further detailing operation of the compressor 760 discussed above regarding FIG. 7. As shown in the diagram 900, quantized activation values $f(Q(y_{i-1}))$ 910 are received from the quantized layer 710. Alternatively, the dequantizer 724 can produce normal precision floating point values 920 based on activation values received from local memory used to implement the quantized layer 710.

As shown in FIG. 9, the quantized values are expressed in a first block floating-point format 910 including a six-bit shared exponent, a sign bit for each individual value, and a six-bit mantissa for each individual value. In some examples, the exponent is not shared by all of a set of values, but can be shared on a per-row, per-column, or per-tile basis.

In the alternative example where a set of normal precision floating-point values 920 are received by the compressor 760, these values are provided to a quantizer 820 which implements a quantization function Q2( ) that converts the normal precision values to a second block floating-point format, different than the block floating-point format used by the quantized layer 710. In the illustrated alternative example, the normal precision floating-point values 920 each have a 10-bit mantissa, a 5-bit exponent (for each value), and a 1-bit sign bit. These normal precision floating-point values 920 are converted to a set of values $Q2(y_i)$ in the first block floating-point format 910, each have a six-bit mantissa, a 1-bit sign bit, and all sharing a six-bit exponent. In some examples, the exponent is not shared by all of a set of values, but can be shared on a per-row, per-column, or per-tile basis.

The outlier quantizer 765 receives the quantized values in the first block floating-point format 910 and identifies a shared exponent that will be shared by mantissas for all of the activation values. As shown, the values from the first block floating-point format 910 are converted to a second block floating-point format 930, which has a shared exponent, and each of the values has a one bit sign and a three-bit mantissa. The shared exponent can be selected a number of different ways. For example, the most common exponent for the set of activation values can be selected as the shared exponent. In some examples, a mean, median, or mode is used to select the shared exponent. In some examples, the shared exponent is selected based on available storage for outlier values. In other words, selected number of outlier values are identified, and a shared exponent suitable for storing the remaining activation values is selected. In some examples, the exponent is not shared by all of a set of values, but can be shared on a per-row, per-column, or per-tile basis. The second block floating-point format further includes data for a number of outlier values. For each identified outlier value, there is an outlier mantissa. In some examples, there is a shared outlier exponent for all of the outlier values, or a portion of outlier values selected on a per-row, per-column or per-tile basis. In some examples, each of the outlier values has its own individual exponent. Further, the outlier values are associated with an outlier index that can be used to identify which of the activation values the outlier value is associated with. The outlier indices can be used when decompressing the activation outlier values.

The set of values in the second block floating-point format 930 can in some examples be provided to additional compression units 960 and 961. Examples of suitable techniques for further compressing activation values in the compressed quantized format include entropy compression, zero compression, run length compression, compressed sparse row compression, or compressed sparse column compression.

Whether or not the quantized values in the second block floating-point format 930 are subject to additional compression, the compressed values $y_{ci}$ and outlier values $o_{ci}$ are stored in the bulk memory 770. The bulk memory 770 is typically implemented in memory structures supporting larger, but often slower access, for example off-chip DRAM, network accessible RAM, SSD drives, hard drives, or network-accessible storage. As will be readily understood to one of ordinary skill in the art having the benefit of the present disclosure, the types and arrangement of memory used to implement memory the bulk memory 770 can be selected depending on desired performance attributes such as costs, energy, and speed. In some examples, the outlier values are stored in a different memory or a different portion of the bulk memory 770.

As will be readily understood to one of ordinary skill in the relevant art having the benefit of the present disclosure, the illustrated normal-precision and block floating-point formats are not limited to the particular selections of mantissa, exponent, and sign bits illustrated, and schemes for sharing exponents between values may also be varied, depending on desired aspects of a particular implementation of the compressor 760. Further, value stored in the bulk memory 770 can be decompressed by reversing the operations shown in the diagram 900.

VII. Example Outlier Quantization Apparatus

Figure 10:
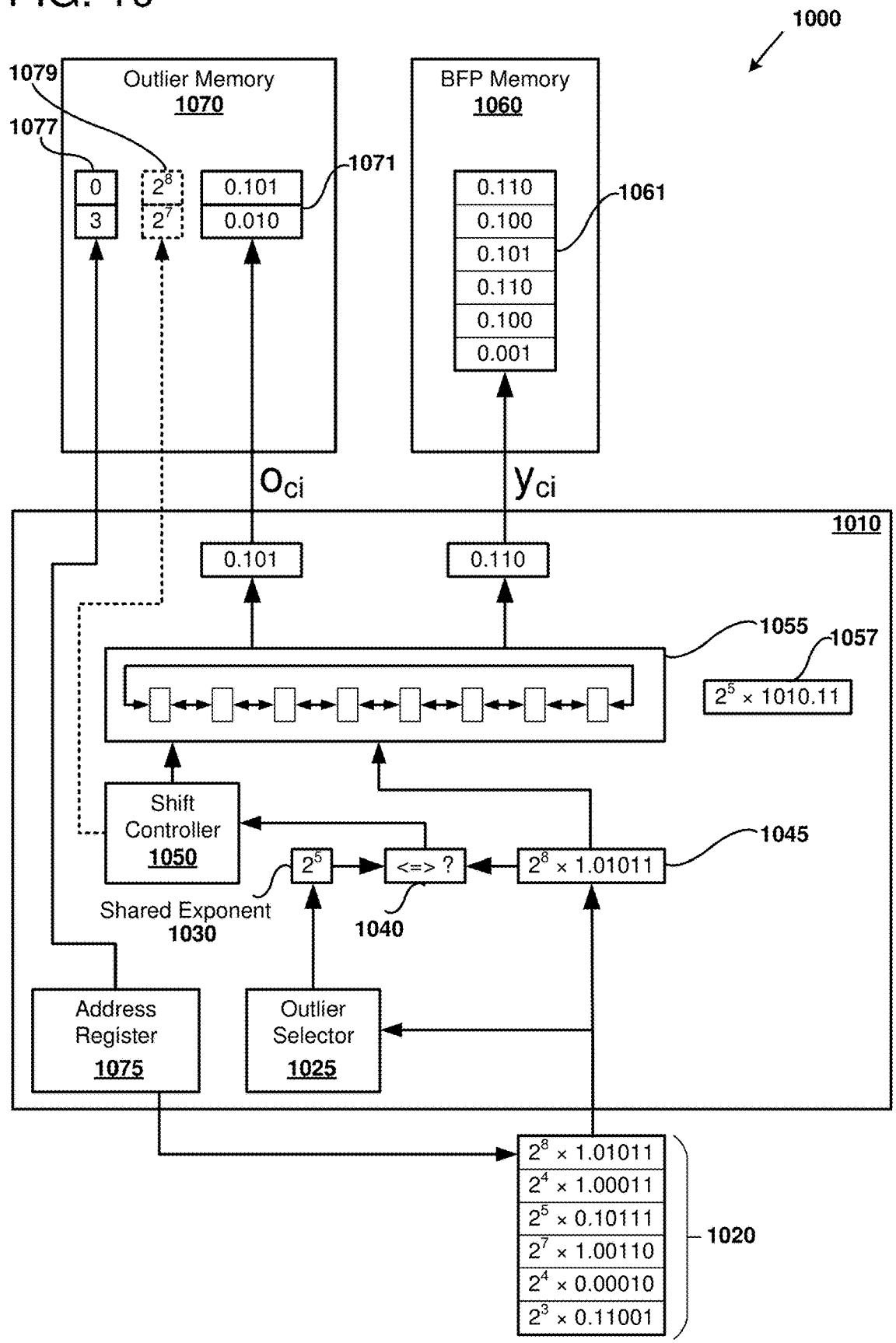
FIG. 10 is a block diagram depicting a high-level example of an outlier quantizer, as can be implemented in certain examples of the disclosed technology.

FIG. 10 is a block diagram 1000 outlining an example outlier quantizer 1010 as can be implemented in certain examples of the disclosed technology. For example, the illustrated outlier quantizer can be used to perform operations associated with the outlier quantizer's discussed above regarding FIGS. 7-9 in, for example the quantization enabled system 110 discussed above.

As shown in FIG. 10, the outlier quantizer 1010 receives a number of activation values expressed in a floating-point format. The floating-point format could be neural precision floating-point or a first block floating-point format. An outlier selector 1025 analyzes the activation values to determine a shared exponent 1030. For each of the activation values 1020, the selected shared exponent 1030 is compared to each 1045 of the activation values using a comparator 1040. If a particular activation value 1045 has a different exponent than the shared exponent 1030, then the shift controller 1050 selects a shift amount and the shifter 1055 is used to shift the mantissa of the activation value left or right, depending on the selected shared exponent 1030.

In the illustrated example, four bits of each of the activation values mantissas $y_{ci}$ are stored as activation value mantissas 1061 in a block floating-point memory 1060. The shift controller 1050 can be used to configure the shifter 1055 to align the four bits of activation value mantissa to be stored in the block floating-point memory 1060 by shifting 1057 the mantissa left or right, based on determinations made by the comparator 1040 when comparing the selected shared exponent and the exponent of the particular activation value 1045.

The outlier selector 1025 also determines which of the activation values 1020 will be selected to have additional bits of mantissa stored as outlier values $o_{ci}$. The shift controller 1050 configures the shifter 1055 such that the other bits of mantissa can be selected as the outlier mantissa values. These outlier mantissa values 1071 are stored in an outlier memory 1070. The outlier quantizer 1010 also includes an address register 1075 that is used to select activation values. The current address of the selected, particular activation value 1045 is used to store an indicator 1077, also called an outlier index, in the outlier memory 1070. In some examples, the outlier memory 1070 also stores an individual exponent 1079 for each of the outlier values as shown in dashed lines. In other examples, the outlier values are associated with a shared exponents, or are assumed to be more significant bits of the mantissas in the first block floating-point format. In the illustrated example, for example, four bits to the left of the and to submit stored in the block floating-point memory 1060 can be stored in the outlier memory 1070, without explicitly storing a shared exponent. In such cases, particular outlier value mantissas may need to be additionally shifted according to the exponent of a given activation value.

Thus, the illustrated outlier quantizer 1010 can maintain higher precision for selected outlier values, while still allowing for compressed storage of mantissas for the bulk of the activation values. In some examples, the quantizer selects a fixed number of outlier values for a group of activation values. For example, every four values out of 64 can be selected as outlier values. In other examples, the outlier values and associated indices and/or exponents can be stored using a data structure that allows for an arbitrary number of outlier values, for example a stack or a queue. As will be readily understood to one of ordinary skill in the relevant art having the benefit of the present disclosure, different configurations and numbers of outlier values and compressed activation values can be selected. In some examples, the outlier memory 1070 and the block floating-point memory 1060 are formed from the same storage device or memory. In other examples, the block floating-point memory 1060 may be formed from a different memory structure and/or type of memory than the memory used to form the outlier memory 1070.

Figure 11:
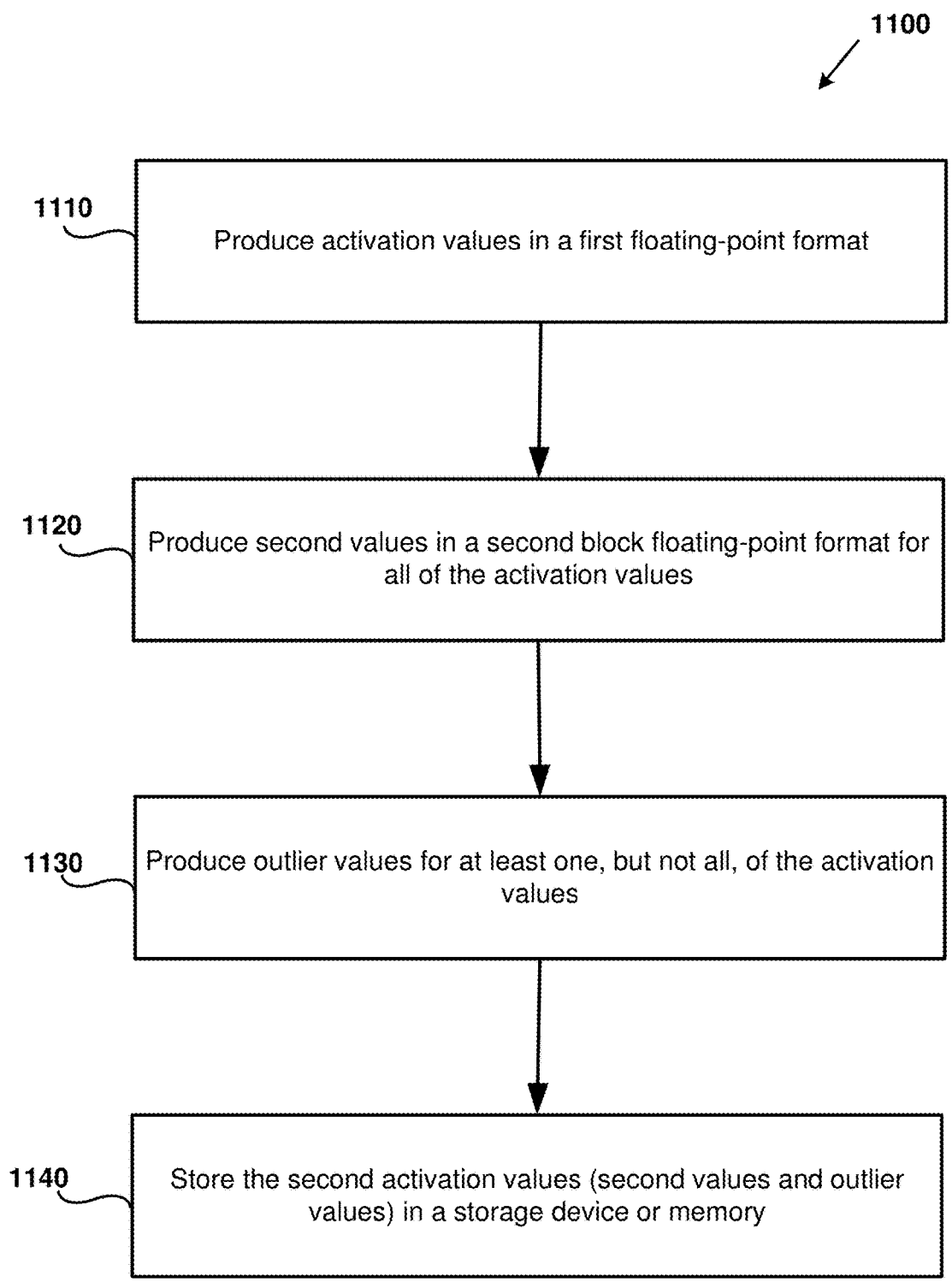
FIG. 11 is a flow chart outlining an example method of producing activation values having outlier values, as can be performed in certain examples of the disclosed technology.

VIII. Example Method of Producing Compressed Activation Values Including Outlier Values FIG. 11 is a flow chart 1100 outlining an example method of producing compressed activation values including outlier values, as can be performed in certain examples of the disclosed technology. As one example, the illustrated method can be performed using a quantization enabled system, such as the quantization enabled system 110 discussed above regarding FIG. 1 and further detailed in the quantization environment discussed above regarding FIG. 7. In some examples, the illustrated method is used as part of a method of training neural networks.

At process block 1110, activation values are produced in a first floating-point format. As discussed further above, the first floating-point format can be a normal-precision loading point format or a first block floating-point format. The activation values can be produced by performing forward propagation when training a layer of a neural network. In some examples, the values can be further compressed by, for example using entropy compression, or another suitable compression scheme. In some examples, the first activation values are converted to a normal precision floating-point format prior to be converted to the second block floating-point format. In other examples, the first activation values are converted directly from the first block floating-point format to the second block floating-point format.

At process block 1120, second values are produced in a second block floating-point format for all of the activation values. For example, the second block floating-point format may have a smaller number of mantissa bits than the normal precision floating-point format or the first block floating-point format. One example of a way to produce the second values is using a shift controller and shifter based on exponents associated with each respective activation value. An outlier selector can be used to determine a shared exponent. Based on the selected, shared exponent, mantissa bits for the uncompressed activation values can be aligned by shifting the mantissa left or right.

At process block 1130, outlier values are produced for at least one, but not all, of the activation values. An outlier selector can be used to determine a shared exponent. Activation values that are larger than a value that can be expressed using the shared exponent can be designated as outliers. In such cases, portions of the mantissa that cannot be expressed with the shared exponent are produced as outlier values. In some examples, a predetermined number of outlier values are produced for a given set of activation values. In some examples, a stack or queue is used to store and arbitrary number of outlier values. An outlier index and/or outlier exponent can be associated with each of the outlier mantissas. Thus, by only storing outliers for a subset of the activation values, memory storage requirements can be reduced.

At process block 1140, the second activation values, comprising the second values produced at process block 1120 and the outlier values produced at process block 1130, are stored in a storage device or memory. In some examples, the second values and the outlier values are stored in the same memory. In other examples, the second values and the outlier values are stored in a different memory. In some examples of the disclosed technology, a processor is used to perform the operations outlined in the flow chart 1100. In some examples, the processors comprise at least one of the following: a tensor processing unit, a neural network accelerator, a graphics processing unit, or a processor implemented in a reconfigurable logic array. In some examples, the outlier values are stored in a memory that is situated on a different integrated circuit than the second values. In some examples, the second values are stored in a memory that is situated on a different integrated circuit than the processors. The bulk memory can be implemented in any suitable storage technology, including, for example, on- or off-chip DRAM, network accessible RAM, SSD drives, hard drives, or network-accessible storage. In some examples, the bulk memory is situated on a different integrated circuit than a hardware accelerator used process block floating-point values. In some examples, the bulk memory is situated on the same integrated circuit as a hardware accelerator used to process block floating-point values. After activation values are stored in the bulk memory, computations for a neural networks can proceed to a next layer. For example, once activation values for a layer have been stored of the bulk memory, forward propagation can continue for a number of different layers in the neural network.

IX. Example Method of Outlier Quantization

Figure 12:
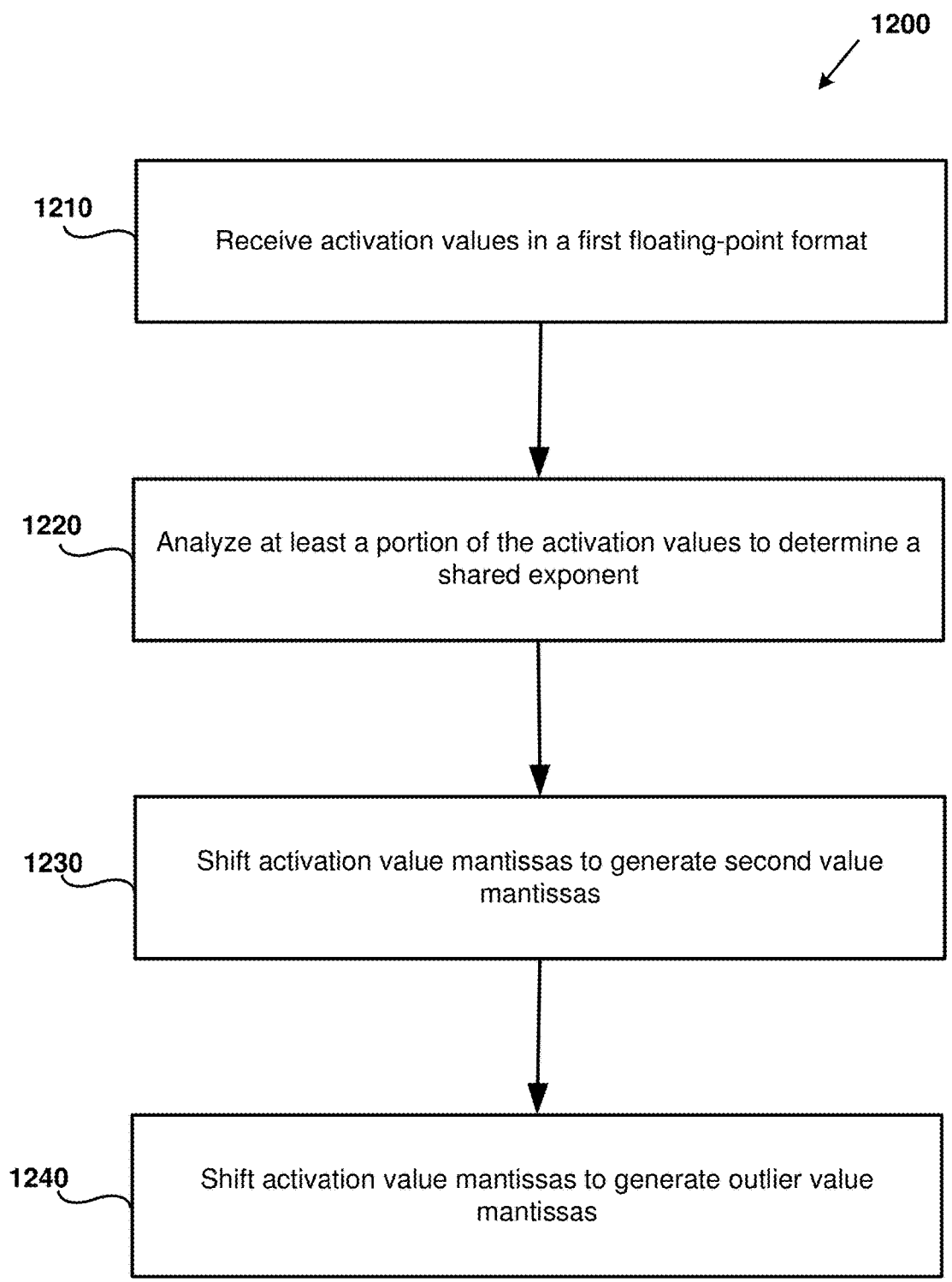
FIG. 12 is a flowchart outlining an example method of generating outlier values, as can be performed in certain examples of the disclosed technology.

FIG. 12 is a flow chart 1200 outlining an example method of generating quantized outlier values, as can be performed in certain examples of the disclosed technology.

For example, the outlier quantizer how hardware discussed above regarding FIG. 10 can be used to implement the illustrated method.

At process block 1210, activation values are received in a first floating-point format. The first floating-point format can be a normal precision floating-point format or a first block floating point format. The normal precision floating-point format numbers can be translated to the first block floating-point format, for example.

At process block 1220, the activation values are analyzed to determine a shared exponent. Any suitable method of determining a shared exponent can be used. For example, a mean, median, or mode of the activation values can be determined and used in determining the shared exponent. Some examples, the most common exponent is selected as the shared exponent. In some examples, a predetermined number of outlier values to generate is selected, and the common exponent is selected based on the accuracy of the remaining compressed activation values. For example, if there will be eight outlier values, the remaining activation values can be analyzed to determine a suitable shared exponent.

At process block 1230, activation value mantissas or shifted according to the shared exponent to generate mantissas for second values. The second values are generated for all of the activation values. The second values can be stored in a storage device or memory. At process block 1240, activation values may be further shifted to generate outlier value mantissas. In some examples, the mantissas are not further shifted, but other bits of the mantissas are simply selected from the shifter to be stored as outlier values. The outlier values, and outlier index, and in some examples an exponent for the outlier can be stored in a storage device or memory. In some examples, the outlier data is stored in the same memory as the second mantissa values. In other examples, the outlier data is stored in a different memory or a different portion of the same memory. In some examples, a stack or queue is used to store values for the outlier data.

X. Example Computing Environment

Figure 13:
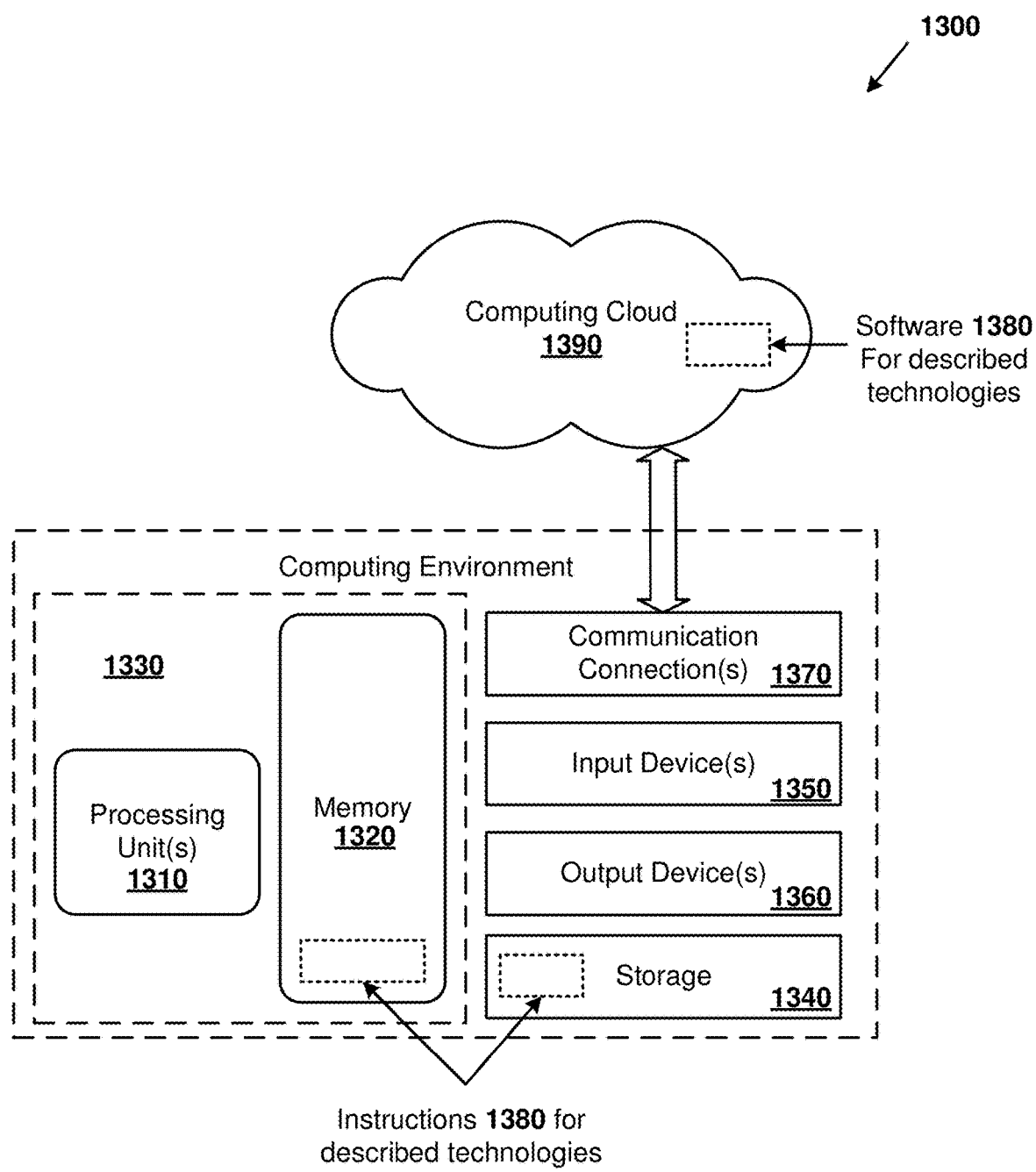
FIG. 13 is a block diagram illustrating a suitable computing environment for implementing some embodiments of the disclosed technology.

FIG. 13 illustrates a generalized example of a suitable computing environment 1300 in which described embodiments, techniques, and technologies, including performing activation compression with outlier values in a quantization environment, can be implemented.

The computing environment 1300 is not intended to suggest any limitation as to scope of use or functionality of the technology, as the technology may be implemented in diverse general-purpose or special-purpose computing environments. For example, the disclosed technology may be implemented with other computer system configurations, including hand held devices, multi-processor systems, programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 13, the computing environment 1300 includes at least one processing unit 1310 and memory 1320. In FIG. 13, this most basic configuration 1330 is included within a dashed line. The processing unit 1310 executes computer-executable instructions and may be a real or a virtual processor. In a multi-processing system, multiple processing units execute computer-executable instructions to increase processing power and as such, multiple processors can be running simultaneously. The memory 1320 may be volatile memory (e.g., registers, cache, RAM), non-volatile memory (e.g., ROM, EEPROM, flash memory, etc.), or some combination of the two. The memory 1320 stores software 1380, images, and video that can, for example, implement the technologies described herein. A computing environment may have additional features. For example, the computing environment 1300 includes storage 1340, one or more input devices 1350, one or more output devices 1360, and one or more communication connections 1370. An interconnection mechanism (not shown) such as a bus, a controller, or a network, interconnects the components of the computing environment 1300. Typically, operating system software (not shown) provides an operating environment for other software executing in the computing environment 1300, and coordinates activities of the components of the computing environment 1300.

The storage 1340 may be removable or non-removable, and includes magnetic disks, magnetic tapes or cassettes, CD-ROMs, CD-RWs, DVDs, or any other medium which can be used to store information and that can be accessed within the computing environment 1300. The storage 1340 stores instructions for the software 1380, plugin data, and messages, which can be used to implement technologies described herein.

The input device(s) 1350 may be a touch input device, such as a keyboard, keypad, mouse, touch screen display, pen, or trackball, a voice input device, a scanning device, or another device, that provides input to the computing environment 1300. For audio, the input device(s) 1350 may be a sound card or similar device that accepts audio input in analog or digital form, or a CD-ROM reader that provides audio samples to the computing environment 1300. The output device(s) 1360 may be a display, printer, speaker, CD-writer, or another device that provides output from the computing environment 1300.

The communication connection(s) 1370 enable communication over a communication medium (e.g., a connecting network) to another computing entity. The communication medium conveys information such as computer-executable instructions, compressed graphics information, video, or other data in a modulated data signal. The communication connection(s) 1370 are not limited to wired connections (e.g., megabit or gigabit Ethernet, Infiniband, Fibre Channel over electrical or fiber optic connections) but also include wireless technologies (e.g., RF connections via Bluetooth, WiFi (IEEE 802.11a/b/n), WiMax, cellular, satellite, laser, infrared) and other suitable communication connections for providing a network connection for the disclosed agents, bridges, and agent data consumers. In a virtual host environment, the communication(s) connections can be a virtualized network connection provided by the virtual host.

Some embodiments of the disclosed methods can be performed using computer-executable instructions implementing all or a portion of the disclosed technology in a computing cloud 1390. For example, the disclosed methods can be executed on processing units 1310 located in the computing environment 1330, or the disclosed methods can be executed on servers located in the computing cloud 1390.

Computer-readable media are any available media that can be accessed within a computing environment 1300. By way of example, and not limitation, with the computing environment 1300, computer-readable media include memory 1320 and/or storage 1340. As should be readily understood, the term computer-readable storage media includes the media for data storage such as memory 1320 and storage 1340, and not transmission media such as modulated data signals.

XI. Experimental Results

FIGS. 14-17 are charts plotting experimental data obtain when training artificial neural networks using activation compression with outlier values.

Figure 14:
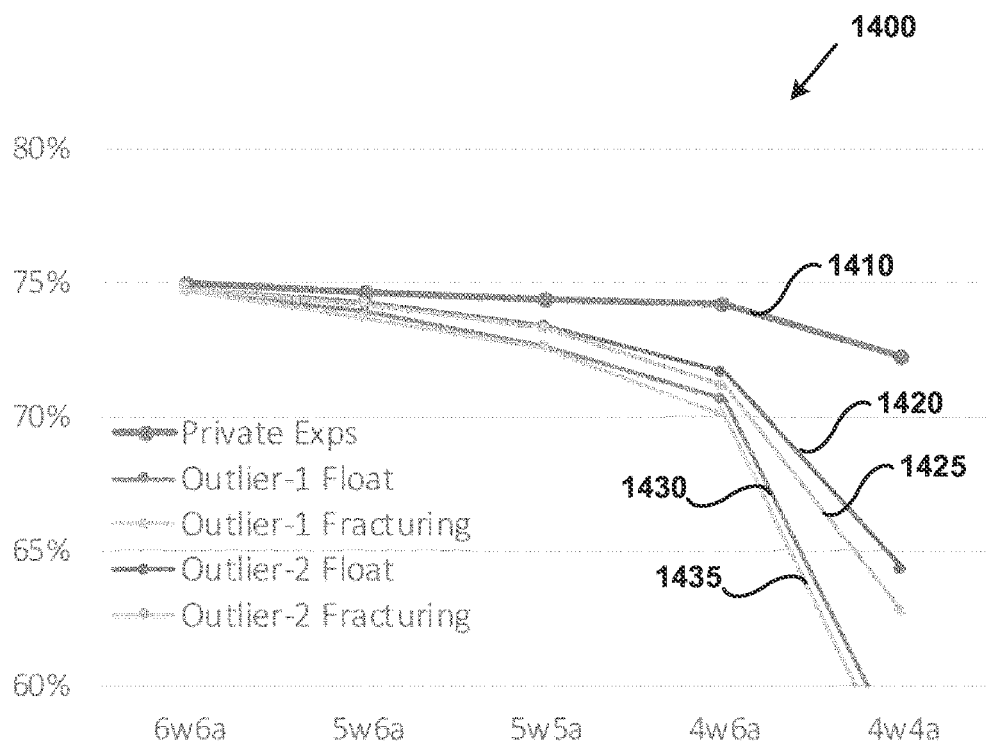
FIGS. 14-17 are charts plotting experimental data obtain when training artificial neural networks using activation compression with outlier values, as can be performed in certain examples of the disclosed technology.

FIG. 14 is a chart 1400 for a test case named ResNet-50. A number of plots indicate accuracy of the neural network when performing activation compression using the indicated block floating-point formats. For example, "6w6a" indicates a block floating-point format having a six-bit wide mantissa and a six-bit wide exponent. As another example, 4w6a indicates a block floating format having a four-bit wide mantissa and a six-bit wide exponent. The accuracy obtained versus a known set of test results is plotted on the y-axis. As shown, a first plot 1410 indicates the most accurate results for this test case are obtained when using an individual exponent for each of the block floating-point values. A second plot 1420 indicates accuracy obtained when using two outliers per 128 activation values, where the outliers are stored as normal-precision floating-point. A third plot 1425 indicates accuracy obtained when using two outliers per 128 activation values, where the outliers are stored with "fractured precision," where outlier values are stored with the number of mantissa bits used for the block floating-point format. In other words, the 6w6a case is stored with 6-bit outlier values and the 4w6a case is stored with 4-bit outlier values. Fourth and fifth plots 1430 and 1435 indicate accuracy obtained when using one outlier per 128 activation values, with normal-precision and fractured precision outlier values. Thus, as shown, using outlier values in a fractured format (in this example, the outlier values have the same number of mantissa bits as the BFP format values) can achieve similar accuracy as full-precision outliers, or even cases with all private exponents, while using less-costly hardware that can be readily integrated with block-floating point hardware.

Figure 15:
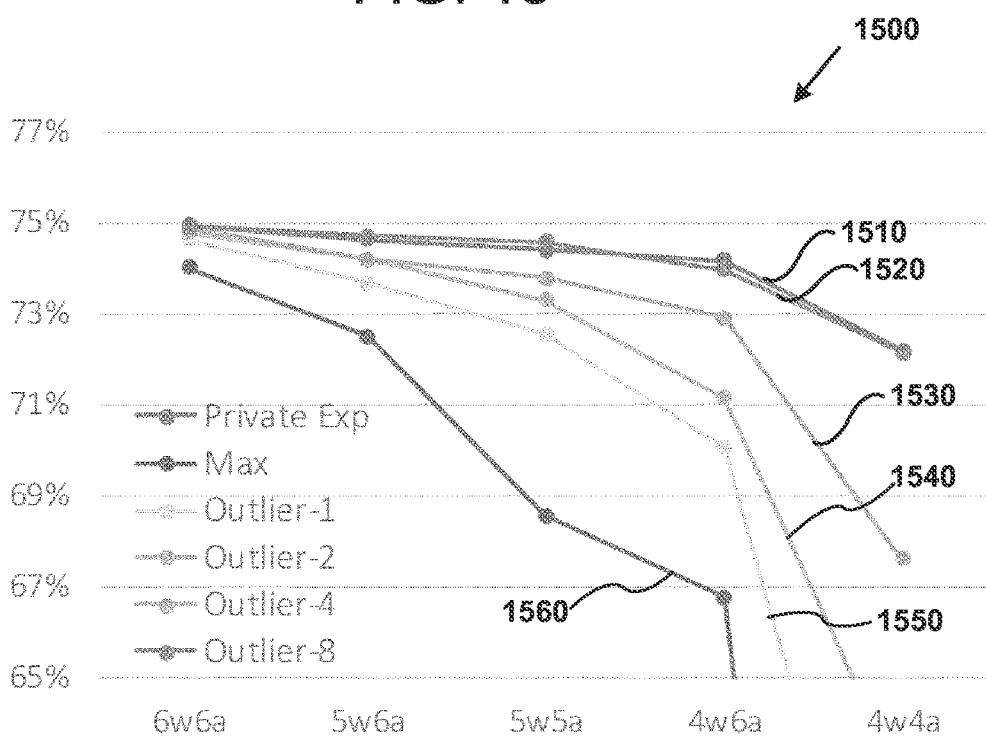

FIG. 15 is a chart 1500 for the same test case as in FIG. 14. As shown, using an increased number of outlier values can improve the accuracy results obtained when training the neural network. As shown, a first plot 1510 indicates the most accurate results for this test case are obtained when using an individual exponent for each of the block floating-point values (private exponent). A second plot 1520 indicates accuracy obtained when using eight outliers per 128 activation values; the precision is comparable to results obtained with all private exponents. Third, fourth, and fifth plots 1530, 1540, and 1550, respectively, indicate accuracy obtained when using four, two, and one outlier per 128 activation values. A sixth plot 1560 indicates accuracy obtained when using a shared exponent across all 128 activation values, with no outlier values. Thus, as shown, using more outlier values increases accuracy, and for the eight-outlier case, is comparable to the private exponent case.

Figure 16:
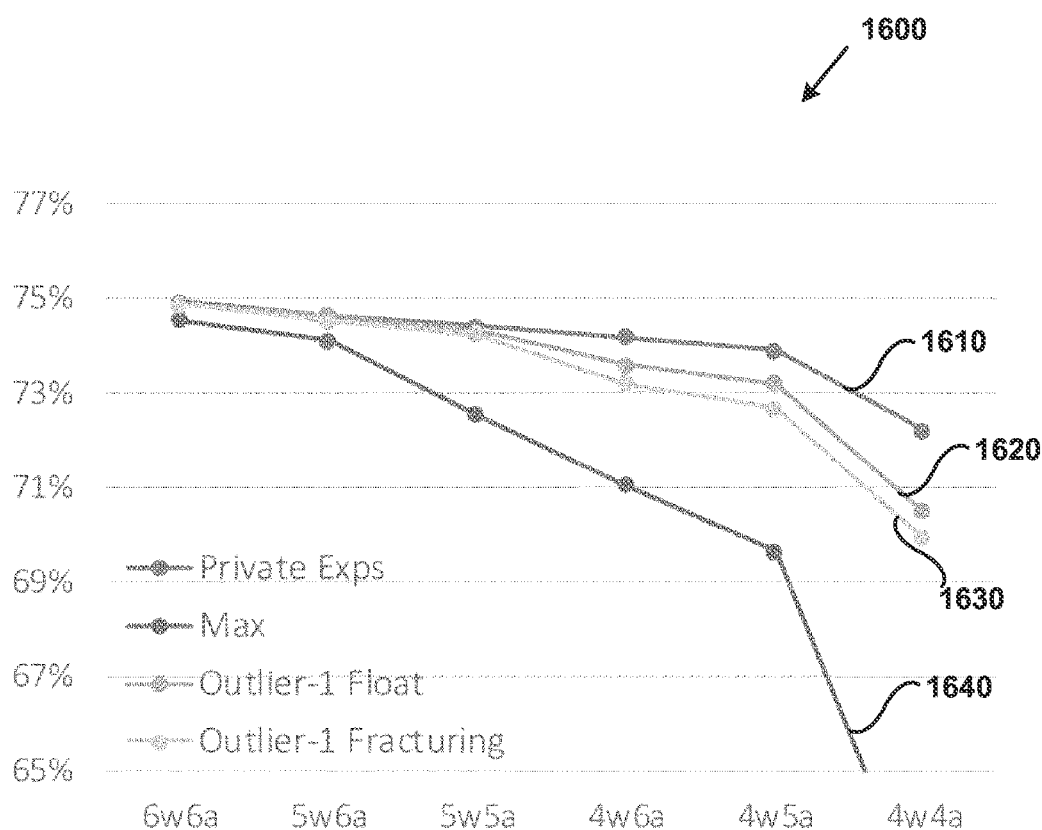

FIG. 16 is a chart 1600 for the same test case as used in FIGS. 13 and 14, but with a number of outlier values per 16 activation values, instead of per 128 values as in FIGS. 14 and 15. As shown, the accuracy of the test cases using outlier values is similar to those using private exponents, depending on the number of mantissa and exponent bits in a particular format. As shown, a first plot 1610 indicates the most accurate results for this test case are obtained when using an individual exponent for each of the block floating-point values (private exponent). A second plot 1620 indicates accuracy obtained when using one normal-precision floating-point outlier value per 16 activation values. A third plot 1630 indicates accuracy obtained when using one fractured-precision outlier per 16 activation values. A fourth plot 1640 indicates accuracy obtained when using a shared exponent across every 16 activation values, with no outlier values.

Figure 17:
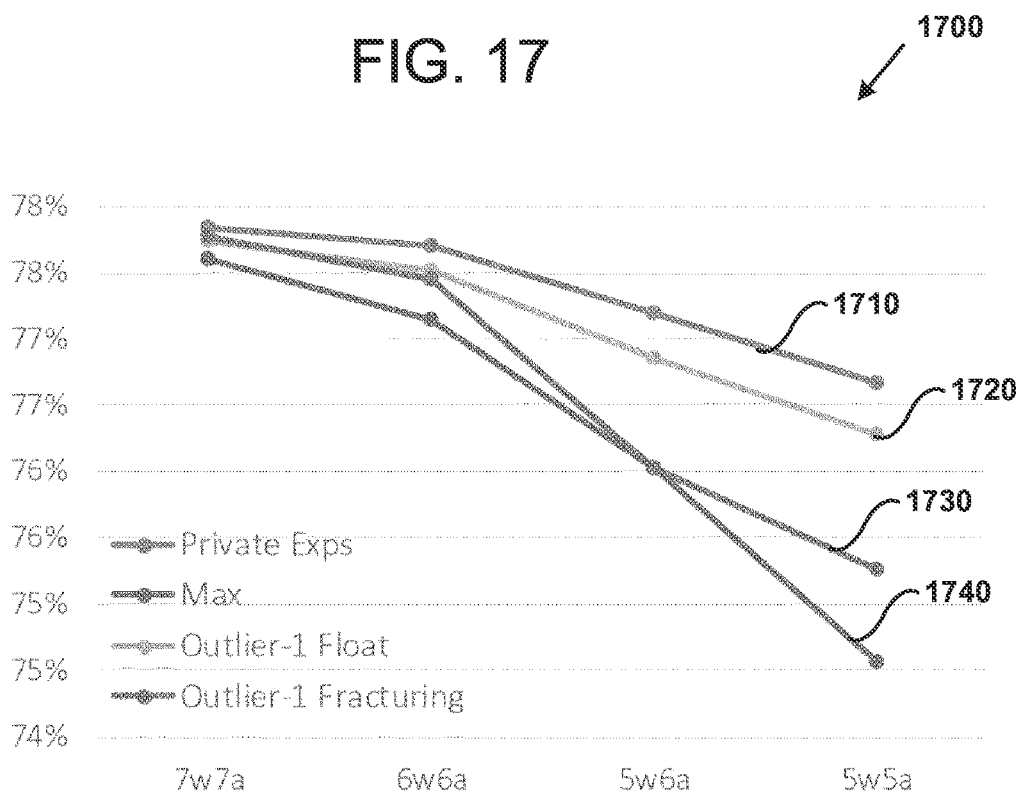

FIG. 17 is a chart 1700 for a different test case named Inception-V3. As shown, accuracy obtained using compressed outlier values can approach the accuracy obtained using individual exponents for all of the test cases. A first plot 1710 indicates the most accurate results for this test case are obtained when using an individual exponent for each of the block floating-point values (private exponent). A second plot 1720 indicates accuracy obtained when using one normal-precision floating-point outlier value per 16 activation values. A third plot 1730 indicates accuracy obtained when using one fractured-precision outlier per 16 activation values. A fourth plot 1740 indicates accuracy obtained when using a shared exponent across every 16 activation values, with no outlier values.

XII. Additional Examples of the Disclosed Technology

Additional examples of the disclosed subject matter are discussed herein in accordance with the examples discussed above. For example, the quantization-enabled system 110 discussed above along with various techniques disclosed for producing and using outlier values can be used in accordance with the specific examples and aspects of the disclosed discussed below.

A system of one or more computers can be configured to perform particular disclosed neural network operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. In some examples of the disclosed technology, a computing system includes one or more processors, memory (including computer-readable storage devices and/or memory), and an outlier quantizer formed from at least one of the processors, and being in communication with the memory. The computing system is configured to: with at least one of the processors, produce first activation values in a first floating-point format, with the outlier quantizer, convert one or more of the first activation values to an outlier block floating-point format, producing second activation values comprising: (1) second values in a second, block floating-point format for all of the first activation values, and (2) outlier values for at least one but not all of the first activation values, and with at least one of the processors, storing the second activation values and the outlier values in the memory. In some examples of the computing system, the first floating-point format is a block floating point format. In some examples, each of the second activation values includes a mantissa having fewer bits than its respective mantissa in the first floating-point format. In some examples, each of the outlier values comprises a respective outlier exponent.

In some examples, the outlier quantizer includes: an outlier selector configured to select a shared exponent for the second values. In some examples, the outlier quantizer further includes: a shift controller coupled to a shifter, the shifter being configured to, based on the selected shared exponent, shift the first activation values to produce mantissas for the second values and mantissas for the outlier values. In some examples, the outlier quantizer further includes a comparator to identify whether a particular one of the first activation values is selected as one of the outlier values. In some examples, the outlier quantizer further includes an address register, and wherein the outlier quantizer is configured to store an index in the memory indicating an address for at least one of the outlier values. In some examples, the outlier quantizer further includes a shifter configured to shift mantissas of the first activation values according to a shared exponent selected for second values, a portion of each of the shifted first activation values forms a mantissa for a respective one of the second values, and a different portion of the shifted first activation values forms an outlier mantissa for the second activation values having an outlier value. In some examples of the computing system, the processors include at least one of the following: a tensor processing unit, a neural network accelerator, a graphics processing unit, or a processor implemented in a reconfigurable logic array, and the memory is situated on a different integrated circuit than the processors, the memory includes dynamic random access memory (DRAM) or embedded DRAM and the system further comprises a hardware accelerator including a memory temporarily storing the first activation values for at least a portion of a layer of the neural network, the hardware accelerator memory including static RAM (SRAM) or a register file.

In some examples of the disclosed technology, a method of operating a computing system implementing a neural network includes, with the computing system: producing first activation values in a first block floating-point format, converting at least one but not all of the first activation values to an outlier block floating-point format different than the first block floating-point format, thereby generating outlier activation values, and storing the outlier activation values in a computer-readable memory or storage device.

In some examples of the method, each of the outlier activation values includes a first mantissa associated with a shared exponent shared by all of the outlier values and a second mantissa associated with a different exponent than the shared exponent. In some examples, the first mantissa and the second mantissa each comprise the same number of bits. In some examples, the method further includes identifying the shared exponent by determining at least one of a mean, a median, and/or a mode for at least a portion of the first activation values. In some examples, the method further includes generating uncompressed activation values by reading the stored outlier activation values from the computer-readable memory or storage device, where for each of the uncompressed activation values: when the uncompressed activation value is associated with an outlier activation value, generating a respective one of the uncompressed activation values by: combining a first value defined by a first mantissa for the uncompressed activation value and a shared exponent with a second value defined by a second mantissa associated with an outlier exponent associated with the uncompressed activation value, and when the uncompressed activation value is not associated with an outlier activation value, generating a respective one of the uncompressed activation values by: producing a first value defined by a first mantissa for the uncompressed activation value and a shared exponent.

In some examples, the method further includes prior to the storing, compressing the outlier activation values stored in the computer-readable memory or storage device by one or more of the following techniques: entropy compression, zero compression, run length encoding, compressed sparse row compression, or compressed sparse column compression.

In some examples, the method further includes producing the first activation values by performing forward propagation for at least one layer of the neural network; performing backward propagation for the at least one layer of the neural network by converting the stored, second activation values to activation values in the first block floating-point format, producing uncompressed activation values; performing a gradient operation with the uncompressed activation values; and updating weights for at least one node of the neural network based on the uncompressed activation values.

In some examples of the disclosed technology, one or more computer-readable storage devices or media store computer-executable instructions, which when executed by a computer, cause the computer to perform a method of configuring a computer system to implement an artificial neural network, the instruction comprising: instructions that cause the computer system to produce first activation values in a first floating-point format; instructions that cause the computer system to generate second activation values for each of the first activation values by: determining that some of the first activation values will be stored as outlier values having a first mantissa associated with a shared exponent and a respective second mantissa associated with a respective outlier exponent, and determining that the remaining values of the first activation values will be stored as a first mantissa associated with the shared exponent, without an associated second mantissa; and storing the second activation values in a computer-readable storage device or memory.

In some examples, the instructions further include instructions that cause the computer system to determine the shared exponent by: identifying a group of largest outliers in the first activation values, and, for a remaining group of the first activation values not identified to be in the group of the largest outliers, determining the shared exponent by selecting the largest exponent of the remaining group. In some examples, the instructions further include instructions that cause the computer system to perform forward propagation for the artificial neural network to produce the first activation values; and instructions that cause the computer system to perform backward propagation for the artificial neural network by converting at least some of the stored, second activation values to the first floating point format by: for the outlier values, adding a first value described by the outlier value's respective first mantissa and the shared exponent to a second value described by the outlier value's respective second mantissa and respective outlier exponent, and for the remaining values, producing a value described by the remaining value's respective first mantissa and the shared exponent.

In some examples of the computing system, the processors include at least one of the following: a tensor processing unit, a neural network accelerator, a graphics processing unit, or a processor implemented in a reconfigurable logic array; and the bulk memory is situated on a different integrated circuit than the processors. The computing system may also include bulk memory (including dynamic random access memory (DRAM) or embedded DRAM) and the system further includes a hardware accelerator including a memory temporarily storing the first activation values for at least a portion of only one layer of the neural network, hardware accelerator memory including static ram (SRAM). In some examples, bulk memory includes dynamic random access memory (DRAM) or embedded DRAM and the system further includes a hardware accelerator including a memory temporarily storing the first activation values for at least a portion of only one layer of the neural network, the hardware accelerator memory including static ram (SRAM) or a register file.

In some examples of the disclosed technology, a method of operating a computing system implementing a neural network includes, with the computing system: forward propagating a layer of the neural network to generate activation values in a first block floating-point format; converting at least one of the activation values to a second block floating-point format different than the first block floating-point format, to generate compressed activation values, and storing the compressed activation values in a computer readable memory or storage device. Implementations of the described techniques may include hardware, a method or process, or computer software on a computer-accessible medium or storage device.

One general aspect of the method includes where the second block floating-point format differs from the first block floating-point format in at least one of the following ways: a different mantissa format, a different exponent format, an outlier value format, or a different exponent sharing scheme. The method also includes the method where the second block floating-point format has a lower numerical precision than the first block floating-point format. Other examples of this aspect include corresponding computer systems, apparatus, and computer programs recorded on one or more computer storage devices, each configured to perform the actions of the methods.

Implementations may include one or more of the following features. For example, the method further including: prior to the storing, further compressing the compressed activation values stored in the computer-readable memory or storage device by prior to the storing, further compressing the compressed activation values stored in the computer-readable memory or storage device by one or more of the following techniques: entropy compression, zero compression, run length encoding, compressed sparse row compression, or compressed sparse column compression. In some examples, the method further includes: with the computing system, performing backward propagation for a layer of the neural network by converting the stored, compressed activation values to activation values in the first block floating-point format to uncompressed activation values. The method may also include with the computing system, performing a gradient operation with the uncompressed activation values. The method may also include with the computing system, updating weights for at least one node of the neural network based on the uncompressed activation values and performing backward propagation for a layer of the neural network by converting the stored, compressed activation values to activation values in the first block floating-point format to uncompressed activation values. The method may also include with the computing system, performing a gradient operation with the uncompressed activation values; and with the computing system, updating weights for a portion of at least one node of the neural network based on the uncompressed activation values, where the at least one node is one of the following: a long-short term memory node (LSTM) or a gated recurrent unit (GRU). The method further includes: selecting the second block floating-point format based on an attribute of the layer, the attribute being selected from the group including of the following: the layer being a convolution layer, the layer including a long-short term memory node (LSTM) or the layer including a gated recurrent unit (GRU). The second block floating-point format can be selected based on an attribute of the layer, the attribute being selected from the group including one or more of the following: the layer being a convolution layer, the layer including a long-short term memory node (LSTM), the layer including a gated recurrent unit (GRU), the layer being fully-connected to another layer, the layer being sparsely-connected to another layer, the layer being an attention layer, the layer being a normalization layer. one or more computer-readable storage devices or media storing computer-executable instructions, which when executed by a computer, cause the computer to perform a method of configuring a computer system to implement an artificial neural network, the instruction including instructions that cause the computer system to implement a first layer of neural network using first weights and/or first activation values expressed in a first block floating-point format. The one or more computer-readable storage devices also includes instructions that cause the computer system to forward propagate values from the first layer of the neural network to a second layer of the neural network, thereby generating second activation values expressed in the first block floating-point format. The one or more computer-readable storage devices also includes instructions that cause the computer system to, prior to performing back propagation for the neural network, store the second activation values in a second, different block floating-point format having outlier values in a bulk memory or storage device in communication with the computer system. In some examples, the one or more computer-readable storage devices also include instructions that cause the computer system temporarily store the first weights and/or the first activation values in a different memory than the bulk memory or storage device. In some examples, the one or more computer-readable storage devices also include instructions that cause the computer system to further compress the second activation values prior to storing the further compressed values in the bulk memory or storage device. In some examples, the instructions cause the computer system to select the second block floating-point format based on an aspect of the second layer. The computer-readable storage devices can also include apparatus and methods for training a neural network accelerator using quantized precision data formats.

In some examples, the input tensor can be a two-dimensional matrix. Converting the input tensor from the normal-precision floating-point format to the block floating-point format can include selecting a plurality of elements within a column of the two-dimensional matrix to share a common exponent in the block floating-point format. Converting the input tensor from the normal-precision floating-point format to the block floating-point format can include selecting a plurality of elements within a row of the two-dimensional matrix to share a common exponent in the block floating-point format. The tensor can have any number of dimensions: one, two, three, four, five, or more dimensions, depending on the particular application.

In some examples of the disclosed technology, one or more computer-readable storage devices or media store computer-executable instructions, which when executed by a computer, cause the computer to perform any one or more of the disclosed methods.

In view of the many possible embodiments to which the principles of the disclosed subject matter may be applied, it should be recognized that the illustrated embodiments are only preferred examples and should not be taken as limiting the scope of the claims to those preferred examples. Rather, the scope of the claimed subject matter is defined by the following claims. We therefore claim as our invention all that comes within the scope of these claims.

What is claimed is:

1. A computing system comprising:
at least one hardware processor, at least one memory coupled to the at least one hardware processor, and computer-readable instructions or hardware implemented logic configured to perform operations comprising:
in a neural network, producing a plurality of first activation values in a first floating-point format for a set of input training data values;
determining one or more outlier activation values of at least a portion of the plurality of first activation values, wherein an outlier activation value has additional bits of precision compared with non-outlier activation values of the at least a portion of the plurality of first activation values;
converting the at least a portion of the plurality of first activation values in the first floating-point format to a first block floating-point format, wherein the first block floating-point format uses a first shared common exponent, the converting providing at least a first non-outlier activation value of the plurality of first activation values in the first block floating-point format and at least a first outlier activation value of the one or more outlier activation values of the at least a portion of the plurality of first activation values in the first block floating-point format;
with an outlier quantizer, converting the additional bits of precision of the at least a first outlier activation value of the one or more outlier activation values of the at least a portion of the plurality of first activation values to a second block floating-point format using a second shared common exponent, wherein the second shared common exponent is selected independently of the first shared common exponent, and thereby produces second activation values;
storing the at least a first non-outlier activation value in the first block floating- point format, the at least a first outlier activation value in the first block floating-point format, and the additional bits of precision of the at least a first outlier activation value in the second block floating-point format to provide stored, compressed activation values; and
during backpropagation, from the stored, compressed activation values, generating uncompressed activation values corresponding to the at least a first non-outlier activation value and the at least a first outlier activation value.

2. The computing system of claim 1, wherein the first floating-point format is a third block floating-point format.

3. The computing system of claim 1, wherein activation values of the second activation values comprise a mantissa having fewer bits than its respective mantissa in the first floating-point format.

4. The computing system of claim 1, wherein the outlier quantizer is configured to select the second shared common exponent.

5. The computing system of claim 1, wherein the outlier quantizer comprises: a shift controller coupled to a shifter, the shifter being configured to, based on a selected first shared common exponent, shift the at least a portion of the plurality of first activation values to produce mantissas for the activation values in the first block floating-point format.

6. The computing system of claim 1, wherein the outlier quantizer comprises a comparator to identify whether a particular one of the at least a portion of the plurality of first activation values is selected as one of the one or more outlier activation values.

7. The computing system of claim 1, wherein the outlier quantizer comprises an address register, and wherein the outlier quantizer is configured to store an index in the at least one memory indicating an address for at least one of the one or more outlier activation values.

8. The computing system of claim 1, wherein:
the outlier quantizer comprises a shifter configured to shift mantissas of the at least a portion of the plurality of first activation values according to the first shared common exponent.

9. The computing system of claim 1, wherein:
the at least one hardware processor comprises at least one of the following: a tensor processing unit, a neural network accelerator, a graphics processing unit, or a processor implemented in a reconfigurable logic array; and
the at least one memory is situated on a different integrated circuit than the at least one hardware processor, the at least one memory comprising dynamic random access memory (DRAM) or embedded DRAM and the computing system further comprises a hardware accelerator including a memory temporarily storing the at least a portion of the plurality of first activation values for at least a portion of a layer of the neural network, the hardware accelerator memory including static RAM (SRAM) or a register file.

10. A method of implementing a neural network, the method comprising:
with a computing system implementing the neural network:
producing a plurality of first activation values for a tensor for a set of input training data values in a first block floating-point format, where the plurality of first activation values share a first shared common exponent in the first block floating-point format and comprise at least a first non-outlier activation value of the plurality of first activation values and at least a first outlier activation value of the plurality of first activation values, wherein an outlier activation value has additional bits of precision compared with non-outlier values of the plurality of first activation values;
converting the additional bits of precision of the at least a first outlier activation value to a second block floating-point format using a second shared common exponent, wherein the outlier activation values are less than all of the plurality of first activation values, the outlier activation values in the second block floating-point format having a second shared common exponent, the second shared common exponent being selected independently of the first shared common exponent, and thereby produces second activation values;
storing the at least a first non-outlier activation value in the first block floating-point format, the at least a first outlier activation value in the first block floating-point format, and the additional bits of precision of the at least a first outlier activation value in the second block floating-point format to provide stored, compressed activation values; and
during backpropagation, from the stored, compressed activation values, generating uncompressed activation values corresponding to the at least a first non-outlier activation value and the at least a first outlier activation value.

11. The method of claim 10, wherein a the at least a first outlier activation value has a first mantissa associated with the first shared common exponent and a second mantissa associated with the second shared common exponent.

12. The method of claim 11, wherein the first mantissa and the second mantissa each comprise a same number of bits.

13. The method of claim 11, further comprising identifying the first shared common exponent by determining at least one of a median, and/or a mode for at least a portion of the plurality of first activation values.

14. The method of claim 10, further comprising:
during the generating uncompressed activation values, reading stored outlier activation values in the first block floating-point format and the second block floating-point format from the stored, compressed activation values, wherein for each of the uncompressed activation values:
when the uncompressed activation value is associated with an outlier activation value, generating a respective one of the uncompressed activation values by:
combining a first value defined by a first mantissa for the uncompressed activation value and the first shared common exponent with a second value defined by a second mantissa associated with the second shared common exponent associated with the uncompressed activation value, and
when the uncompressed activation value is not associated with an outlier activation value, generating a respective one of the uncompressed activation values by:
producing a first value defined by a first mantissa for the uncompressed activation value and the first shared common exponent.

15. One or more computer-readable storage devices or media storing computer-executable instructions, which when executed by a computer, cause the computer to perform operations comprising:
producing first activation values for a set of input training data values for a neural network in a first floating-point format;
converting the first activation values to second activation values in a first block floating-point format having a first shared common exponent, the converting providing at least a first non-outlier activation value of a plurality of first activation values in the first block floating-point format and at least first outlier activation value of the plurality of first activation values in the first block floating-point format, wherein an outlier activation value has additional bits of precision compared with non-outlier activation values in the first block floating-point format;
converting the additional bits of precision of the at least a first outlier activation value of the one or more outlier values to a second block floating-point format using a second shared common exponent, wherein the second shared common exponent is selected independently of the first shared common exponent, and thereby produces second activation values;
storing the at least a first non-outlier activation value in the first block floating-point format, the at least a first outlier activation value in the first block floating-point format, and the additional bits of precision of the at least a first outlier activation value in the second block floating-point format to provide stored, compressed activation values; and during backpropagation, from the stored, compressed activation values, generating uncompressed activation values corresponding to the at least a first non-outlier activation value and the at least a first outlier activation value.

16. The one or more computer-readable storage devices or media of claim 15, wherein the at least a first outlier activation value in the second block floating-point format comprises a first mantissa associated with the second shared common exponent and a corresponding value for a respective outlier activation value in the second block floating-point format comprises a second mantissa associated with the first shared common exponent.

17. The one or more computer-readable storage devices or media of claim 16, wherein the first mantissa and the second mantissa each comprise a same number of bits.

18. The computing system of claim 1, the neural network being further configured to:

store respective index values for the one or more outlier activation values associating a value in the first block floating-point format for a respective outlier activation value of the one or more outlier activation values with a corresponding value for the respective outlier activation value of the one or more outlier activation values in the second block floating-point format.

19. The computing system of claim 1, wherein the first block floating-point format is a common format as the second block floating-point format, apart from use of the first shared common exponent and the second shared common exponent.

20. The computing system of claim 1, wherein the second shared common exponent is selected such that values in the second block floating-point format have a same number of mantissa bits as values in the first block floating-point format.

21. The method of claim 10, further comprising:

with the computing system implementing the neural network, storing respective index values for a respective plurality of outlier activation values associating a value in the second block floating-point format for a respective outlier value of the plurality of outlier activation values with a corresponding value for the respective outlier activation value of the plurality of outlier activation values in the first block floating-point format.

22. The computing system of claim 1, wherein a respective outlier value of the one or more outlier activation values has a first mantissa associated with the first shared common exponent and a second mantissa associated with the second shared common exponent.

* * * * *